(12) United States Patent
Haick et al.

(10) Patent No.: US 11,916,148 B2
(45) Date of Patent: Feb. 27, 2024

(54) MULTI-FUNCTIONAL FIELD EFFECT TRANSISTOR WITH INTRINSIC SELF-HEALING PROPERTIES

(71) Applicant: TECHNION RESEARCH AND DEVELOPMENT FOUNDATION LIMITED, Haifa (IL)

(72) Inventors: Hossam Haick, Haifa (IL); Muhammad Khatib, Haifa (IL)

(73) Assignee: TECHNION RESEARCH AND DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 18/067,702

(22) Filed: Dec. 17, 2022

(65) Prior Publication Data

US 2023/0117378 A1 Apr. 20, 2023

Related U.S. Application Data

(63) Continuation of application No. 17/268,628, filed as application No. PCT/IL2019/050927 on Aug. 20, 2019, now Pat. No. 11,563,122.

(Continued)

(51) Int. Cl.
*H01L 29/78* (2006.01)
*H01L 29/06* (2006.01)
(Continued)

(52) U.S. Cl.
CPC .... *H01L 29/78603* (2013.01); *H01L 29/0669* (2013.01); *H01L 29/1608* (2013.01);
(Continued)

(58) Field of Classification Search
CPC . H01L 29/0669; H01L 29/1608; H01L 29/24; H01L 29/42384; H01L 29/66969; H01L 29/78603
(Continued)

(56) References Cited

U.S. PATENT DOCUMENTS 3,905,944 A 9/1975 Finelli
4,021,414 A 5/1977 Saracsan
(Continued)

FOREIGN PATENT DOCUMENTS

CN 101971305 A 2/2011
CN 109485824 A 3/2019
(Continued)

OTHER PUBLICATIONS

Rao et al., (2016) Stretchable Self-Healing Polymeric Dielectrics Cross-Linked Through Metal-Ligand Coordination. J Am Chem Soc 138(18): 6020-6027 (8 pages).
(Continued)

*Primary Examiner* — Monica D Harrison
(74) *Attorney, Agent, or Firm* — Roach Brown McCarthy & Gruber, P.C.; Kevin D. McCarthy

(57) ABSTRACT

A self-healing field-effect transistor (FET) device is disclosed in this application, the self-healing FET has a self-healing substrate, a self-healing dielectric layer, a gate electrode, at least one source electrode, at least one drain electrode, and at least one channel. The self-healing substrate and the self-healing dielectric layer have a disulfide-containing poly(urea-urethane) (PUU) polymer. The self-healing dielectric layer has a thickness of less than about 10 μm. The electrodes have electrically conductive elongated nanostructures. The at least one channel has semi-conducting elongated nanostructures.

20 Claims, 18 Drawing Sheets

Related U.S. Application Data

(60) Provisional application No. 62/720,132, filed on Aug. 21, 2018.

(51) Int. Cl.

| | | |
|---|---|---|
| *H01L 29/16* | (2006.01) | |
| *H01L 29/24* | (2006.01) | |
| *H01L 29/423* | (2006.01) | |
| *H01L 29/66* | (2006.01) | |
| *H01L 29/786* | (2006.01) | |

(52) U.S. Cl.
CPC ........ *H01L 29/24* (2013.01); *H01L 29/42384* (2013.01); *H01L 29/66969* (2013.01)

(58) Field of Classification Search
USPC .......................................................... 257/24
See application file for complete search history.

(56) References Cited

U.S. PATENT DOCUMENTS

| | | |
|---|---|---|
| 8,247,524 B2 | 8/2012 | Janssen et al. |
| 8,309,950 B2 | 11/2012 | Iwayama et al. |
| 8,383,697 B2 | 2/2013 | Wilson et al. |
| 8,679,621 B2 | 3/2014 | Blaiszik et al. |
| 9,080,942 B2 | 7/2015 | Zhong et al. |
| 9,625,341 B2 | 4/2017 | Haick et al. |
| 11,092,563 B2 | 8/2021 | Haick et al. |
| 11,563,122 B2 * | 1/2023 | Haick ............... H01L 29/42384 |
| 2007/0117289 A1 | 5/2007 | Akiyama |
| 2009/0148690 A1 | 6/2009 | Krasteva et al. |
| 2011/0143101 A1 | 6/2011 | Sandhu |
| 2012/0062245 A1 | 3/2012 | Bao et al. |
| 2012/0245434 A1 | 9/2012 | Haick et al. |
| 2012/0245854 A1 | 9/2012 | Haick et al. |
| 2013/0034910 A1 | 2/2013 | Haick et al. |
| 2015/0082920 A1 | 3/2015 | Haick et al. |
| 2016/0123947 A1 | 5/2016 | Briman et al. |
| 2016/0195488 A1 | 7/2016 | Ensor et al. |
| 2017/0008999 A1 | 1/2017 | Odriozola et al. |
| 2018/0231486 A1 | 8/2018 | Haick et al. |
| 2020/0002501 A1 | 1/2020 | Yun et al. |

FOREIGN PATENT DOCUMENTS

| | | |
|---|---|---|
| EP | 2597110 A1 | 5/2013 |
| KR | 20120015918 A | 2/2012 |
| KR | 101126048 B1 | 3/2012 |
| KR | 101801548 B1 | 11/2017 |
| WO | 2009066293 A1 | 5/2009 |
| WO | 2009118739 A1 | 10/2009 |
| WO | 2010079490 A1 | 7/2010 |
| WO | 2010128007 A1 | 11/2010 |
| WO | 2011148371 A1 | 12/2011 |
| WO | 2012023138 A2 | 2/2012 |
| WO | 2012169655 A1 | 12/2012 |
| WO | 2013079469 A1 | 6/2013 |
| WO | 2013144788 A1 | 10/2013 |
| WO | 2014116335 A2 | 7/2014 |
| WO | 2016046135 A1 | 3/2016 |
| WO | 2016118536 A2 | 7/2016 |
| WO | 2017029660 A1 | 2/2017 |

OTHER PUBLICATIONS

Rekondo et al., (2014) Catalyst-free room-temperature self-healing elastomers based on aromatic disulfide metathesis. Materials Horizons 1(2): 237-240 (5 pages).
Rogers et al., (2009) A curvy, stretchy future for electronics. Proc Natl Acad Sci U S A 106(27): 10875-10876 (3 pages).
Segev-Bar and Haick (2013) Flexible sensors based on nanoparticles. ACS Nano 7(10): 8366-8378 (13 pages).
Segev-Bar et al., (2013) Tunable touch sensor and combined sensing platform: Toward nanoparticle-based electronic skin. ACS Applied Materials & Interfaces 5(12): 5531-5541 (11 pages).
Sekiguchi et al., (2015) Robust and Soft Elastomeric Electronics Tolerant to Our Daily Lives. Nano Lett 15(9): 5716-5723 (8 pages).
Sekitani et al., (2008) A Rubberlike Stretchable Active Matrix Using Elastic Conductors. Science 321(5895): 1468-1472 (6 pages).
Shamanna et al., (2006) Micromachined integrated pressure-thermal sensors on flexible substrates. Journal of Micromechanics and Microengineering 16: 1984-1992 (10 pages).
Siffalovic et al., (2010) Towards strain gauges based on a self-assembled nanoparticle monolayer—SAXS study. Nanotechnology 21(38): 385702 (6 pages).
Snow et al., (2005) High-mobility carbon-nanotube thin-film transistors on a polymeric substrate. Appl Phys Lett 86: 033105; (3 pages).
Someya et al., (2004) A large-area, flexible pressure sensor matrix with organic field-effect transistors for artificial skin applications. Proc Natl Acad Sci U S A 101(27): 9966-9970 (5 pages).
Takei et al., (2010) Nanowire active-matrix circuitry for low-voltage macroscale artificial skin. Nature Materials 9(10): 821-826 (6 pages).
Tee et al., (2012) An electrically and mechanically self-healing composite with pressure- and flexion-sensitive properties for electronic skin applications. Nature Nanotechnology 7(12): 825-832 (8 pages).
Tisch and Haick (2010) Arrays of chemisensitive monolayer-capped metallic nanoparticles for diagnostic breath testing. Reviews in Chemical Engineering 26(5-6): 171-179 (10 pages).
Tisch and Haick (2010) Nanomaterials for cross-reactive sensor arrays. MRS Bulletin 35(10): 797-803 (8 pages).
Tiwana et al., (2012) A review of tactile sensing technologies with applications in biomedical engineering. Sensors and Actuators A: Physical 179: 17-31 (15 pages).
Toohey et al., (2007) Self-healing materials with microvascular networks. Nature Materials 6(8): 581-585 (5 pages).
Torsi et al., (2013) Organic field-effect transistor sensors: a tutorial review. Chem Soc Rev 42(22): 8612-8628 (17 pages).
Vossmeyer et al., (2008) Networked Gold-Nanoparticle Coatings on Polyethylene: Charge Transport and Strain Sensitivity. Advanced Functional Materials 18(11): 1611-1616 (6 pages).
Walker (2012) A review of technologies for sensing contact location on the surface of a display. Journal of the Society for Information Display 20(8): 413-440 (28 pages).
Wang et al., (2009) Thin film assemblies of molecularly-linked metal nanoparticles and multifunctional properties. Langmuir 26(2): 618-632 (15 pages).
Wang et al., (2013) Self-healing chemistry enables the stable operation of silicon microparticle anodes for high-energy lithium-ion batteries. Nature Chemistry 5(12): 1042 (7 pages).
Wang et al., (2013) User-interactive electronic skin for instantaneous pressure visualization. Nature Materials 12(10): 899-904 (23 pages).
Watanabe et al., (2017) Autonomic healing of thermoplastic elastomer composed of triblock copolymer. J Mater Sci 52: 1214-1220 (7 pages).
White et al., (2001) Autonomic healing of polymer composites. Nature 409(6822): 794-797 (5 pages).
Wu et al., (2008) Self-healing polymeric materials: a review of recent developments. Progress in Polymer Science 33(5): 479-522 (44 pages).
Wuelfing and Murray (2002) Electron hopping through films of arenethiolate monolayer-protected gold clusters. The Journal of Physical Chemistry B 106(12): 3139-3145 (7 pages).
Xing et al., (2016) Self-Healable Polymer Nanocomposites Capable of Simultaneously Recovering Multiple Functionalities. Advanced Functional Materials 26(20): 3524-3531 (8 pages).
Yin et al., (2011) Molecularly mediated thin film assembly of nanoparticles on flexible devices: electrical conductivity versus device strains in different gas/vapor environment. ACS Nano 5(8): 6516-6526 (11 pages).

(56) References Cited

OTHER PUBLICATIONS

Ying et al., (2011) Design and experiment of flexible multifunctional tactile sensors for robot skin. CAAI Transactions on Intelligence Technology 3(1): 30-41. English translation (29 pages).
Anonymous: "Surface Properties", Feb. 2, 2023 (Feb. 2, 2023), pp. 1-3, XP093020453. Retrieved from the Internet: URL: https://polymerdatabase.com/polymer%20physics/SurfaceTension.html [retrieved on Feb. 2, 2023]; and according to https://web.archive.org/web/20230000000000*/https://polymerdatabase.com/polymer%20physics/SurfaceTension.html, was "Saved 39 times between Oct. 20, 2016 and Dec. 28, 2019."
Alvares et al., (2011) Nanoparticle films as biomimetic tactile sensors. Procedia Engineering 25: 1349-1352 (5 pages).
Amamoto et al., (2012) Self-healing of covalently cross-linked polymers by reshuffling thiuram disulfide moieties in air under visible light. Advanced Materials 24(29): 3975-3980 (92 pages).
Balazs (2007) Modeling self-healing materials. Materials Today 10(9): 18-23 (6 pages).
(Benight et al., (2013) Stretchable and self-healing polymers and devices for electronic skin. Progress in Polymer Science 38(12): 1961-1977 (17 pages).
Bergman and Wudl (2008) Mendable polymers. Journal of Materials Chemistry 18(1): 41-62 (22 pages).
Bhattacharya and Chaklader (1982) Review on metal-filled plastics. Part1. Electrical conductivity. Polymer-Plastics Technology and Engineering 19(1): 21-51 (32 pages).
Blaiszik et al., (2010) Self-healing polymers and composites. Annual Review of Materials Research 40: 179-211 (35 pages).
Boland (2010) Flexible electronics: Within touch of artificial skin. Nat Mater 9(10): 790-792 (2 pages).
Broza and Haick (2013) Nanomaterial-based sensors for detection of disease by volatile organic compounds. Nanomedicine 8(5): 785-806 (23 pages).
Brust et al., (1994) Synthesis of thiol-derivatised gold nanoparticles in a two-phase liquid-liquid system. Journal of the Chemical Society, Chemical Communications (7): 801-802 (3 pages).
Burattini et al., (2009) A novel self-healing supramolecular polymer system. Faraday Discussions 143: 251-264 (16 pages).
Canadell et al., (2011) Self-healing materials based on disulfide links. Macromolecules 44(8): 2536-2541 (6 pages).
Chen et al., (2002) A thermally re-mendable cross-linked polymeric material. Science 295(5560): 1698-1702 (6 pages).
Cheng et al., (2009) A flexible capacitive tactile sensing array with floating electrodes. Journal of Micromechanics and Microengineering 19: 115001 (11 pages).
Chortos et al., (2016) Mechanically Durable and Highly Stretchable Transistors Employing Carbon Nanotube Semiconductor and Electrodes. Adv Mater 28(22): 4441-4448 (8 pages).
Cordier et al., (2008) Self-healing and thermoreversible rubber from supramolecular assembly. Nature 451(7181): 977-980 (4 pages).
Cosseddu et al., (2012) Strain Sensitivity and Transport Properties in Organic Field-Effect Transistors. IEEE Elec Dev Lett 33(1): 113-115 (4 pages).
Dovgolevsky et al., (2010) Monolayer-capped cubic platinum nanoparticles for sensing nonpolar analytes in highly humid atmospheres. The Journal of Physical Chemistry C 114(33): 14042-14049 (8 pages).
Engel et al., (2003) Development of polyimide flexible tactile sensor skin. Journal of Micromechanics and Microengineering 13: 359-366 (8 pages).
Farcau et al., (2011) High-sensitivity strain gauge based on a single wire of gold nanoparticles fabricated by stop-and- go convective self-assembly. ACS Nano 5(9): 7137-7143 (7 pages).
Farcau et al., (2011) Monolayered wires of gold colloidal nanoparticles for high-sensitivity strain sensing. The Journal of Physical Chemistry C 115(30): 14494-14499 (6 pages).
Farserotu et al., (2012) Smart skin for tactile prosthetics. 6th International Symposium on Medical Information and Communication Technology (ISMICT), IEEE, Mar. 25, 2012 (Mar. 25, 2012), pp. 1-8; XP032183647 (9 pages).

Fratoddi et al., (2015) Chemiresistive polyaniline-based gas sensors: A mini review. Sensors and Actuators B: Chemical 220: 534-548 (15 pages).
Haick (2007) Chemical sensors based on molecularly modified metallic nanoparticles. Journal of Physics D: Applied Physics 40(23): 7173-7186 (15 pages).
Hammock et al., (2013) 25th anniversary article: the evolution of electronic skin (e-skin): a brief history, design considerations, and recent progress. Advanced Materials 25(42): 5997-6038 (42 pages).
He et al., (2016) A novel thin-film transistor using carbon nanotubes as both channel and electrodes. 2016 IEEE International Conference on Electron Devices and Solid-State Circuits (EDSSC); Aug. 3-5, 2016, Hong Kong, China. DOI: 10.1109/EDSSC.2016.7785199; (4 pages).
Herrmann et al., (2007) Nanoparticle films as sensitive strain gauges. Applied Physics Letters 91(18): 183105 (4 pages).
Hostetler et al., (1998) Alkanethiolate gold cluster molecules with core diameters from 1.5 to 5.2 nm: core and monolayer properties as a function of core size. Langmuir 14(1): 17-30 (14 pages).
Hsu et al., (2011) A Locally Amplified Strain Sensor Based on a Piezoelectric Polymer and Organic Field-Effect Transistors. IEEE Transactions on Electron Devices 58(3): 910-917 (8 pages).
Huang et al., (2015) A High-Capacitance Salt-Free Dielectric for Self-Healable, Printable, and Flexible Organic Field Effect Transistors and Chemical Sensor. Adv Funct Mater 25(24): 3745-3755 (11 pages).
Huynh and Haick (2016) Self-Healing, Fully Functional, and Multiparametric Flexible Sensing Platform. Adv Mater 28(1): 138-143 (7 pages).
Huynh et al., (2016) Composites of Polymer and Carbon Nanostructures for Self-Healing Chemical Sensors. Advanced Materials Technologies 1(9): 1600187; (8 pages).
Huynh et al., (2017) Advanced Materials for Use in Soft Self-Healing Devices. Advanced Materials 29(19): 1604973; (14 pages).
Joseph et al., (2007) Vapor Sensitivity of Networked Gold Nanoparticle Chemiresistors: Importance of Flexibility and Resistivity of the Interlinkage. J Phys Chem C 111(34): 12855-12859 (5 pages).
Kim et al., (2018) Superior Toughness and Fast Self-Healing at Room Temperature Engineered by Transparent Elastomers. Adv Mater 30(1): 1705145; (8 pages).
Konvalina and Haick (2011) Effect of humidity on nanoparticle-based chemiresistors: a comparison between synthetic and real-world samples. ACS Applied Materials & Interfaces 4(1): 317-325 (9 pages).
Lacour et al., (2011) Elastic components for prosthetic skin. Conf Proc IEEE Eng Med Biol Soc 2011: 8373-8376 (4 pages).
Lee and Nicholls (1999) Review Article Tactile sensing for mechatronics—a state of the art survey. Mechatronics 9(1): 1-31 (31 pages).
Li et al., (2017) Self-healable Gels for Use in Wearable Devices. Chem Mater 29(21): 8932-8952 (21 pages).
Liang et al., (2015) Intrinsically stretchable and transparent thin-film transistors based on printable silver nanowires, carbon nanotubes and an elastomeric dielectric. Nat Commun 6: 7647; (10 pages).
Liang et al., (2015) Intrinsically stretchable and transparent thin-film transistors based on printable silver nanowires, carbon nanotubes and an elastomeric dielectric. Nat Commun 6: 7647. Supplementary Information (20 pages).
Maheshwari et al., (2006) High-Resolution Thin-Film Device to Sense Texture by Touch. Science 312(5779): 1501-1504 (5 pages).
Mannsfeld et al., (2010) Highly sensitive flexible pressure sensors with microstructured rubber dielectric layers. Nature Mater 9: 859-864 (7 pages).
Martin et al., (2014) The processability of a poly (urea-urethane) elastomer reversibly crosslinked with aromatic disulfide bridges. Journal of Materials Chemistry A 2(16): 5710-5715 (6 pages).
Matsuzaki et al., (2008) Rubber-based strain sensor fabricated using photolithography for intelligent tires. Sensors and Actuators A: Physical 148(1): 1-9 (9 pages).
Nicolay et al., (2010) Responsive gels based on a dynamic covalent trithiocarbonate cross-linker. Macromolecules 43(9): 4355-4361 (7 pages).
Oh et al., (2016) Intrinsically stretchable and healable semiconducting polymer for organic transistors. Nature 539: 411-415 (11 pages).

(56) References Cited

OTHER PUBLICATIONS

Olichwer et al., (2012) Cross-Linked Gold Nanoparticles on Polyethylene: Resistive Responses to Tensile Strain and Vapors. ACS Appl Mater Interfaces 4(11): 6151-6161 (11 pages).

Pang et al., (2012) A flexible and highly sensitive strain gauge sensor using reversible interlocking of nanofibers. Nature Mater 11: 795-801 (7 pages).

Peng et al., (2009) Diagnosing lung cancer in exhaled breath using gold nanoparticles. Nature Nanotechnology 4(10): 669-673 (6 pages).

* cited by examiner

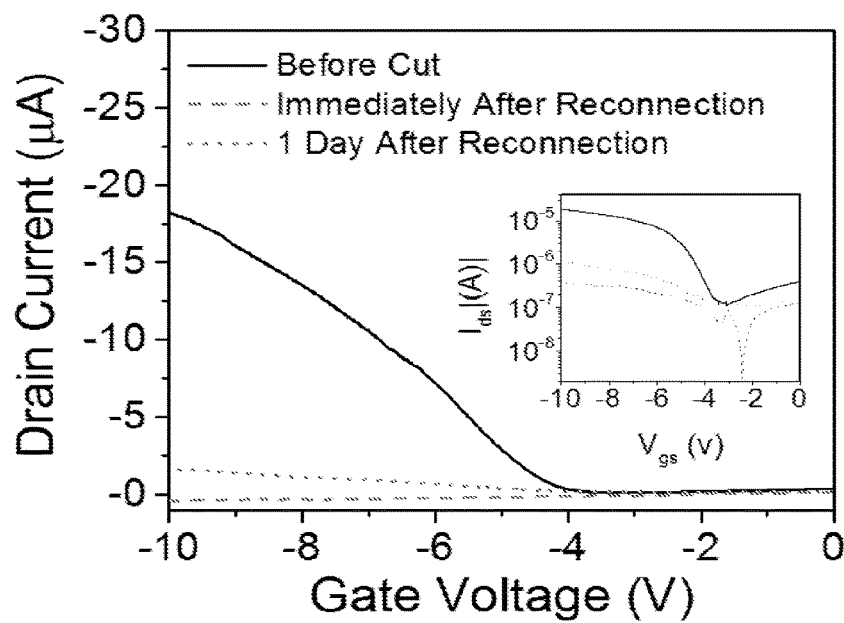
FIGURE 13
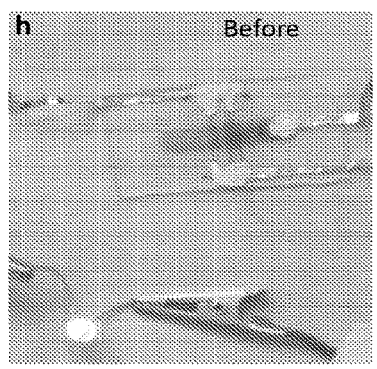
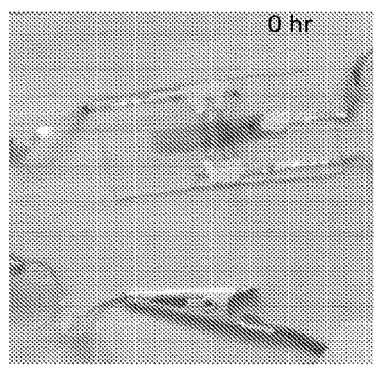
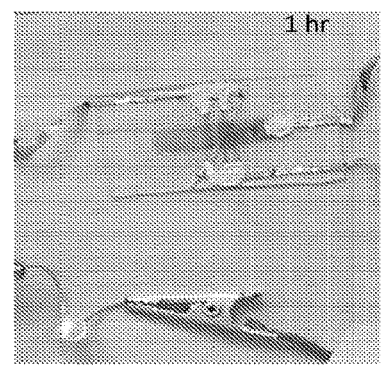
FIGURE 14A  FIGURE 14B  FIGURE 14C

MULTI-FUNCTIONAL FIELD EFFECT TRANSISTOR WITH INTRINSIC SELF-HEALING PROPERTIES

FIELD OF THE INVENTION

The present invention is directed to a self-healing field-effect transistor (FET) comprising a self-healing polyurethane-based polymer and elongated nanostructures, such as, for example, carbon nanotubes and/or metal nanowires, for the detection of temperature and humidity.

BACKGROUND OF THE INVENTION

Soft and flexible devices offer a wide spectrum of promising applications, e.g., epidermal sensors that can continuously monitor health status of a human, including parameters such as temperature, sweat, and motion. Such devices would revolutionize present prognosis methods by introducing fast, cheap, and non-invasive alternatives to the currently existing methods. Soft and flexible sensors should satisfy several mechanical requirements, including conformal attachment to the body, stretchability and softness, while providing greater sensing efficiency. However, devices with said properties are susceptible to mechanical and/or structural damage (e.g., cracks and scratches), which can result from the combined effect of their soft nature and incompatibility with human skin during mechanical stress. Inevitably, said mechanical instability leads to a lower durability, decreased life-time, and reduced performance. To address this issue, one can mimic biological systems by introducing a self-healing capability—a vital property for many organisms in nature—into flexible and soft devices, allowing the recovery of damages without external intervention.

Excellent progress in the development of the self-healing materials has been made in non-electronic systems, as well as in chemiresistors, supercapacitors and electrochemical devices (Benight, S. J. et al., Stretchable and self-healing polymers and devices for electronic skin. Prog. Polym. Sci. 38, 1961-1977 (2013); Huynh, T.P. et al., Advanced Materials 28 (2016): 138-143; Huynh T.-P., et al., Composites of Polymer and Carbon Nanostructures for Self-Healing Chemical Sensors. Adv. Mater. Technol., 1: 1600187 (2016); Huynh, T. P. et al., Advanced Materials for Use in Soft Self-Healing Devices. Adv. Mater. 29, 1604973 (2017); Li, J. et al., Self-healable Gels for Use in Wearable Devices. Chem. Mater. 29, 8932-8952 (2017)).

International Patent Application No. WO 2017/029660 to some of the inventors of the present invention is directed to a self-healing platform unit for pressure and analyte sensing, and a method for fabrication thereof, the platform unit comprising a self-healing substrate comprising a dynamically crosslinked polymer comprising polymeric chains and crosslinking bridges; at least one self-healing electrode comprising a non-crosslinked polymer and metal microparticles dispersed therein, wherein the at least one self-healing electrode is deposited on the substrate; and at least one sensor comprising metal nanoparticles capped with an organic coating, wherein the at least one sensor is deposited on the substrate and is in electric contact with the at least one self-healing electrode. The self-healing substrate can have a thickness ranging from about 0.5 mm to about 10 mm.

Field-effect transistors (FETs) which are used as sensors offer considerable advantages as compared to other competing strategies by delivering a label-free response with extractable multi-parameters, using a simple electronic read-out set-up that can be easily miniaturized by employing printed circuit technologies (Torsi, L et al., Organic field-effect transistor sensors: a tutorial review. Chem. Soc. Rev. 42, 8612-8628 (2013)). Briefly, a FET includes a combination of a source electrode and a drain electrode to conduct electron or hole current generated from a semiconducting layer between said electrodes. The FET further includes a gate electrode which regulates current density through applied voltage together with a dielectric layer beneath. Organic-based FETs (OFETs), in which the active semiconducting material is an organic compound or conjugated polymer generally have limited application due to the low field effect mobilities ($\mu$) realized in such devices and their poor reliability. To overcome the drawbacks associated with the use of organic compounds, carbon nanotube field-effect transistors (CNTFETs) have been developed, utilizing a single carbon nanotube or an array of carbon nanotubes as the channel material. The electrodes of the CNTFET device can also be made of carbon nanotubes (He, Peijian et al., A novel thin-film transistor using carbon nanotubes as both channel and electrodes. 13-16. 10.1109/ED-SSC.2016.7785199 (2016)).

For the construction of self-healing FETs, self-healing dielectric, electrically conductive and semi-conducting materials are required. Organic self-healing dielectric based on poly(2-hydroxypropyl methacrylate)/poly(ethyleneimine) PPMA/PEI copolymer was developed for fabrication of OFET (W. Huang, et al., Adv. Funct. Mater. 2015, 25, 3745). Self-healing of PPMA/PEI is mainly from hydrogen bonds between imine of PEI and hydroxyl or acrylate groups of PPMA. Additional self-healing dielectric materials which have been suggested for use in OFETs include surface functionalized boron nitride nanosheets (BNNSs) incorporated into self-healing polymers (L. Xing et al., Adv. Funct. Mater. 2016, 26, 3524) and $Fe^{2+}$ or $Zn^{2+}$ based metal salts dispersed in functionalized polydimethylsiloxane (PDMS) (Y.-L. Rao et al., J. Am. Chem. Soc. 2016, 138, 6020).

Preparation of the self-healing semi-conducting material is, however, more challenging. The difficulty in obtaining such material arises from the rigidity of semi-conductors because of their conjugated and highly crystalline structure, which is contradictory to the softness and high chain mobility of self-healing materials. Recently, Bao and coworkers have succeeded in synthesizing a healable semi-conducting polymer based on 3,6-di(thiophen-2-yl)-2,5-dihydropyrrolo[3,4-c]pyrrole-1,4-dione repeating units and non-conjugated 2,6-pyridine dicarboxamide moieties with a $\mu_h$ of ~1.4 $cm^2$ $V^{-1}$ $s^{-1}$, ~106 on/off ratio, and high operating voltages up to −60 V. Nevertheless, the healing process needed solvent treatment or high temperatures for electrical and mechanical recovery with the limitation of self-healable damage size (<100 nm nanocracks) as well (Oh, J. Y. et al. Intrinsically stretchable and healable semiconducting polymer for organic transistors. Nature 539, 411 (2016)).

To the inventors' best knowledge, FETs in which each element is self-healable at room temperature and self-healing proceeds without specific treatments, have not yet been developed. There exists, therefore, an unmet need for a fully self-healable FET, which can retain the structure, as well as the function thereof, following mechanical damage, under ambient conditions.

SUMMARY OF THE INVENTION

The present invention provides a self-healing field-effect transistor using technology which is based on a combination of conducting and semi-conducting elongated nanostructures and self-healing dielectric layer, configured to impart self-healing properties to the FET as a whole. Advantageously, the dielectric layer has a thickness of less than about 10 µm, the FET therefore being particularly suitable for use in epidermal applications, electronic and artificial skins and wearable devices.

The present invention is based in part on an unexpected finding that a self-healing dielectric layer can be used in conjunction with a semi-conducting elongated nanomaterial, such as, for example, semi-conducting CNTs to provide a self-healing semi-conducting channel. The inventors of the present invention were able to fabricate an exceptionally thin self-healing dielectric layer, upon which the CNTs are deposited or in which they are embedded, said dielectric layer having long-term mechanical and functional stability despite its low thickness. An intrinsic self-healing ability of the self-healing layer is afforded by a disulfide-containing poly(urea-urethane) (PUU) polymer.

Source, drain, and gate electrodes can be made of any elongated nanomaterial having high electrical conductivity. Preferably, the FET electrodes comprise electrically conductive CNTs, ensuring low resistance contact between the CNTs-based semi-conducting channel and source and drain electrodes, further reducing the operating voltages of the FET of the invention and increasing hole mobility. The FET electrodes can further be made of metallic nanowires, e.g., silver nanowires (AgNWs). Self-healing properties of the electrodes are afforded by the self-healing dielectric layer of the FET.

The FET device according to the principles of the present invention has been shown to have repeatable intrinsic and autonomic self-healing ability, enabling the restoration of its electrical and mechanical properties both after micro-scale damage and complete cut of the device without the aid of external trigger, such as, for example, heat, light, or organic solvent vapor. In addition to the biomimetic features, such as self-healing and elasticity, the FET of the invention has multi-functional sensing properties, including, inter alia, detection of temperature and humidity, which can be particularly useful in the production of highly sustainable and reliable soft electronic devices and systems.

Further provided is a method for the preparation of said FET device. Advantageously, the FET can be fabricated by transfer printing, being particularly suitable for use with self-healing polymers, thereby allowing easy transfer and efficient attachment of the FET layers.

According to one aspect, there is provided a self-healing field-effect transistor (FET) device comprising a self-healing substrate and a self-healing dielectric layer, said substrate and said layer comprising a disulfide-containing poly(urea-urethane) (PUU) polymer, wherein the dielectric layer has a thickness of less than about 10 µm, a gate electrode, at least one source electrode, and at least one drain electrode, said electrodes comprising electrically conductive elongated nanostructures; and at least one channel comprising semi-conducting elongated nanostructures.

According to some embodiments, the FET device is in a form selected from the group consisting of a back-gated transistor, top-gated transistor, and vertical transistor. Each possibility represents a separate embodiment of the invention. In certain embodiments, the FET device is in a form of a back-gated transistor, wherein the gate electrode is disposed on the self-healing substrate and contacts a bottom side of the dielectric layer, and wherein the at least one source electrode, the at least one drain electrode, and the at least one channel are disposed on a top side of the dielectric layer, the at least one channel being in electric contact with the at least one source electrode and the at least one drain electrode.

The electrically conductive elongated nanostructures, semi-conducting elongated nanostructures or both can be selected from the group consisting of nanotubes, nanowires, nanoribbons, nano-whiskers, nanostrips, nanorods, and combinations thereof. In some embodiments, the electrically conductive elongated nanostructures are made of a material selected from the group consisting of a metal, metal alloy, carbon, and combinations thereof. The metal can be selected from the group consisting of Ag, Au, Ti, Cu, Pd, Pt, Ni, and Al. In some embodiments, the semi-conducting elongated nanostructures are made of a material selected from the group consisting of carbon, silicon, and combinations thereof. Each possibility represents a separate embodiment of the invention.

In some exemplary embodiments, the electrically conductive elongated nanostructures comprise electrically conductive carbon nanotubes (CNTs) and the semi-conducting elongated nanostructures comprise semi-conducting CNTs. In additional exemplary embodiments, the electrically conductive elongated nanostructures comprise silver nanowires and the semi-conducting elongated nanostructures comprise semi-conducting CNTs.

In some embodiments, the electrically conductive elongated nanostructures of the gate electrode are embedded within the self-healing substrate. In some embodiments, the semi-conducting elongated nanostructures of the at least one channel are deposited onto the at least one source electrode and the at least one drain electrode. In additional embodiments, the semi-conducting elongated nanostructures of the at least one channel are embedded within a surface portion of the dielectric layer.

According to some embodiments, the self-healing substrate has a thickness of less than about 5 µm. In further embodiments, the dielectric layer has a thickness of less than about 5 µm. In still further embodiments, the FET device has a thickness of less than about 10 µm.

According to some embodiments, the disulfide-containing poly(urea-urethane) polymer is composed of a 4-aminophenyl disulfide (APDS) monomer and a poly(propylene glycol) tolylene 2,4-diisocyanate terminated (PPG-TDI) monomer. In further embodiments, the mass of the PPG-TDI monomer is at least 7 times higher than the mass of the APDS monomer. In still further embodiments, the mass ratio between the APDS monomer and the PPG-TDI monomer ranges from about 11:100 to about 13:100. In some exemplary embodiments, the mass ratio between the APDS monomer and the PPG-TDI monomer is about 12:100.

In some embodiments, the at least one channel has a thickness of less than about 50 nm. In further embodiments, the at least one channel has a length of less than about 500 µm and width of less than about 1 cm.

According to some embodiments, the semi-conducting elongated nanostructures are arranged in a random network configuration.

According to some embodiments, the FET device comprises a plurality of source electrodes, a plurality of drain electrodes, and a plurality of channels.

The at least one source electrode and the at least one drain electrode can have a thickness of less than about 500 nm. In some embodiments, the gate electrode has a thickness of less than about 500 nm.

In some embodiments, the FET device further comprises an elastic layer. The elastic layer can comprise a polymer selected from the group consisting of polystyrene-blockpolyisoprene-block-polystyrene (PS-b-PI-b-PS), polydimethylsiloxane (PDMS), polybutadiene rubber, polyurethane thermoplastic elastomer, and combinations and derivatives thereof. Each possibility represents a separate embodiment of the invention.

According to some embodiments, the elastic layer contacts the self-healing substrate. According to additional embodiments, the elastic layer contacts the at least one channel, the at least one source electrode and/or the at least one drain electrode.

In some embodiments, the FET device further comprises a protecting layer. The protecting layer can comprise a polymer selected from the group consisting of PDMS, PS-b-PI-b-PS, 1-styrene-butadiene-styrene block copolymer (SBS), 2-styrene ethylene butylene styrene block copolymer (SEBS), polybutadiene rubber, polyurethane thermoplastic elastomer, and combinations and derivatives thereof. Each possibility represents a separate embodiment of the invention.

According to some embodiments, the protecting layer contacts the at least one channel, the at least one source electrode and the at least one drain electrode, or the elastic layer.

The FET device can further comprise a backing layer. The backing layer can be made of a material selected from cellulose, polyethylene terephthalate (PET), polyethylene naphthalate (PEN), polyimide (Kapton), and combinations and derivatives thereof. In some embodiments, the FET device further comprises an adhesive layer. The adhesive layer can comprise a polymer selected from the group consisting of polyvinyl alcohol (PVA), polyethyleneimine (PEI) and polyethylene glycol (PEG). Each possibility represents a separate embodiment of the invention. In some embodiments, the backing layer and/or the adhesive layer contacts the self-healing substrate.

According to some currently preferred embodiments, the FET does not include a substrate made of a material other than the disulfide-containing PUU polymer. In certain embodiments, the FET device consists essentially of the self-healing substrate, the gate electrode, the at least one source electrode, the at least one drain electrode, the self-healing dielectric layer, and the at least one channel, wherein the self-healing substrate and the dielectric layer consist essentially of the disulfide-containing PUU polymer, the electrodes consist essentially of electrically conductive CNTs, and the channel consists essentially of semi-conducting CNTs. In additional embodiments, the FET device consists essentially of the self-healing substrate, the gate electrode, the at least one source electrode, the at least one drain electrode, the self-healing dielectric layer, and the at least one channel, wherein the self-healing substrate and the dielectric layer consist essentially of the disulfide-containing PUU polymer, the electrodes consist essentially of silver nanowires, and the channel consists essentially of semi-conducting CNTs.

The FET device according to the various embodiments presented hereinabove can be configured for temperature sensing, humidity sensing or both. According to some embodiments, the FET device is for use in high humidity conditions.

In some embodiments, the FET device is coupled to a detection device for measuring a change in at least one property of the at least one drain electrode, at least one source electrode, gate electrode, or any combination thereof, said at least one property selected from the group consisting of current, threshold voltage, hole mobility, and electrical potential.

The FET device can be integrated on electronic or artificial skin surface.

According to another aspect, there is provided a method for fabricating the FET device according to the various embodiments presented hereinabove, the method comprising: applying an aqueous dispersion comprising electrically conductive elongated nanostructures onto a rigid substrate, thereby forming the gate electrode; applying a solution comprising the disulfide-containing PUU polymer or prepolymer on top of the gate electrode, thereby forming the self-healing substrate; transferring the gate electrode and the self-healing substrate to a flexible substrate, wherein the self-healing substrate contacts the flexible substrate; applying the aqueous dispersion comprising electrically conductive elongated nanostructures onto a rigid substrate, thereby forming the at least one source electrode and the at least one drain electrode; applying the solution comprising the disulfide-containing PUU polymer or prepolymer on top of the at least one source electrode and the at least one drain electrode, thereby forming the self-healing dielectric layer; transferring the at least one source electrode, the at least one drain electrode, and the self-healing dielectric layer to the gate electrode, wherein the dielectric layer contacts the gate electrode; and applying an aqueous dispersion comprising semi-conducting elongated nanostructures onto the at least one source electrode and the at least one drain electrode, thereby forming the at least one channel.

According to some exemplary embodiments, the method further comprises a step of separating the flexible substrate from the self-healing substrate.

The steps of applying the aqueous dispersion comprising electrically conductive elongated nanostructures can be performed by a process selected from the group consisting of spraying, dip-coating, spin-coating, drop-casting, field enhanced deposition, soft lithography, inkjet printing, screen printing and combinations thereof. Each possibility represents a separate embodiment of the invention. In some embodiments, the steps of applying the aqueous dispersion comprising electrically conductive elongated nanostructures comprise applying the dispersion to form a predetermined pattern. In certain embodiments, the aqueous dispersion comprising electrically conductive elongated nanostructures comprises electrically conductive CNTs having a concentration ranging from about 0.1 mg/ml to about 10 mg/ml. In additional embodiments, the concentration of the semi-conducting elongated nanostructures in the aqueous dispersion ranges from about 0.0001 mg/ml to about 0.01 mg/ml. In certain embodiments, the aqueous dispersion comprising electrically conductive elongated nanostructures comprises silver nanowires having a concentration ranging from about 1 mg/ml to about 50 mg/ml.

In some embodiments, the disulfide-containing PUU polymer is composed of a 4-aminophenyl disulfide (APDS) monomer and a poly(propylene glycol) tolylene 2,4-diisocyanate terminated (PPG-TDI) monomer. In further embodiments, the mass ratio between the APDS monomer and the PPG-TDI monomer ranges from about 11:100 to about 13:100. The steps of applying the solution comprising the disulfide-containing PUU polymer or prepolymer can be performed by a process selected from the group consisting of drop-casting, spin-coating, dip-coating, drop-coating, printing, screen printing, and combinations thereof. According to certain embodiments, the steps of applying the solution comprising the disulfide-containing PUU polymer or prepolymer are performed by drop-casting followed by spin-coating at a rate of from about 500 rpm to about 3000 rpm for about 10 sec to about 10 min.

The rigid substrate in step (a) can be selected from the group consisting of a silicon wafer, glass, sapphire, quartz, metal oxide, and combinations thereof. In some embodiments, the flexible substrate in step (c) comprises a polymer selected from the group consisting of PS-b-PI-b-PS, PET, PEN, and Kapton. Each possibility represents a separate embodiment of the invention.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Some of the embodiments of the invention are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the invention. For the sake of clarity, some objects depicted in the figures are not to scale.

FIGS. 7A-7C: Photographs of the epidermal ultrathin FET device applied to skin, wherein FIG. 7A shows the FET device in the relaxed mode, FIG. 7B shows the FET device in the compressed mode and FIG. 7C shows the FET device in the stretched mode.

FIG. 13: Recovery after cutting the whole device in 2 parts through the channel.

FIGS. 14A-14C: photographs showing the self-healing ability of the FET device after being severed with scissors, as represented by the intensity of LED that is driven by the FET before the cut (FIG. 14A), directly after reconnecting the 2 cut parts (FIG. 14B), and 1 h after reconnection (FIG. 14C).

FIG. 21A and FIG. 21B show different areas of the same electrode.

DETAILED DESCRIPTION OF THE INVENTION

Figure 1A:
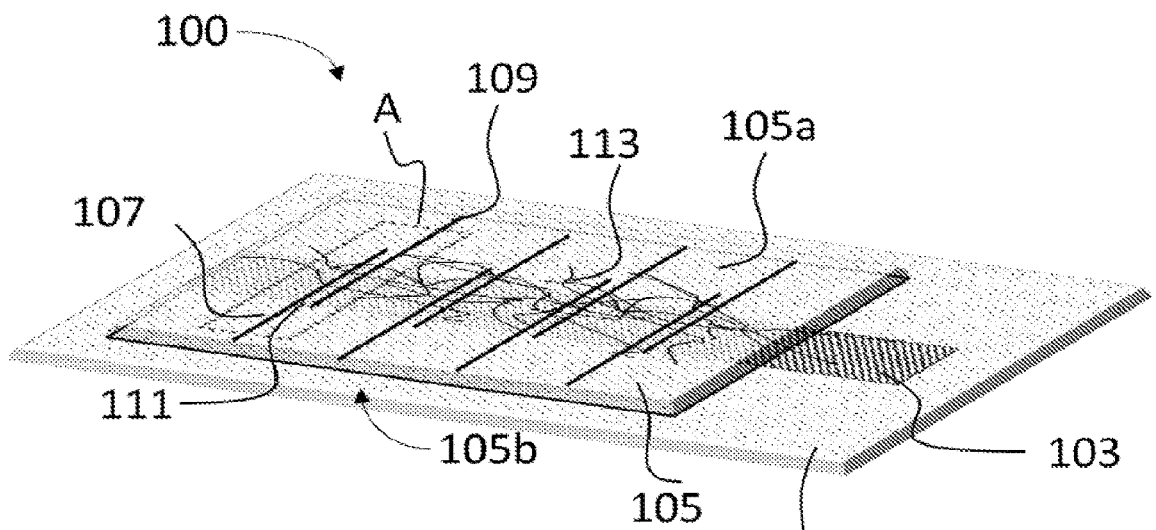
FIG. 1A: Schematic representation of the FET device comprising a self-healing substrate, a self-healing dielectric layer, a gate electrode, a plurality of source and drain electrodes, and a plurality of channels, in accordance with some embodiments of the invention.
Figure 1B:
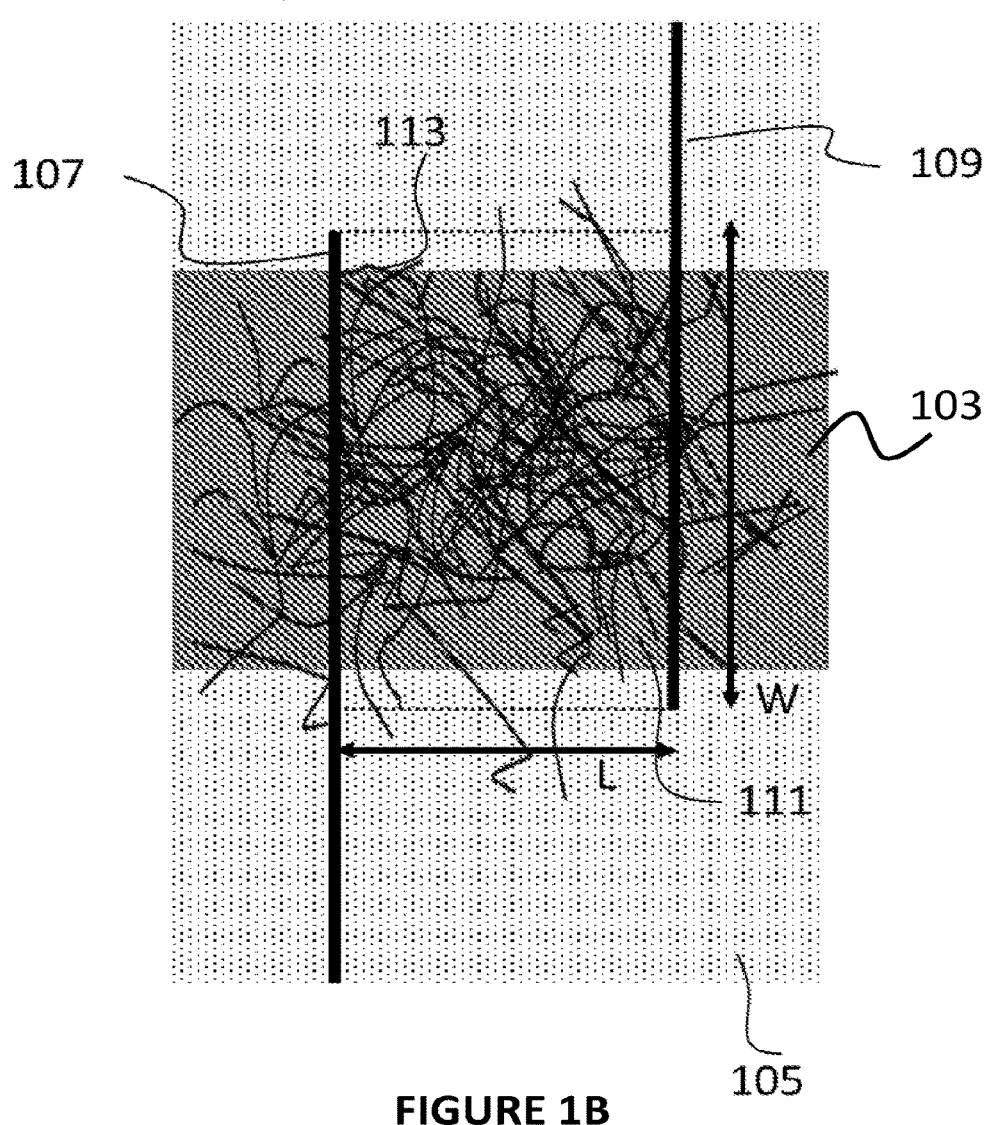
FIG. 1B: Schematic top view representation of the channel of the FET device in accordance with some embodiments of the invention.
Figure 2A:
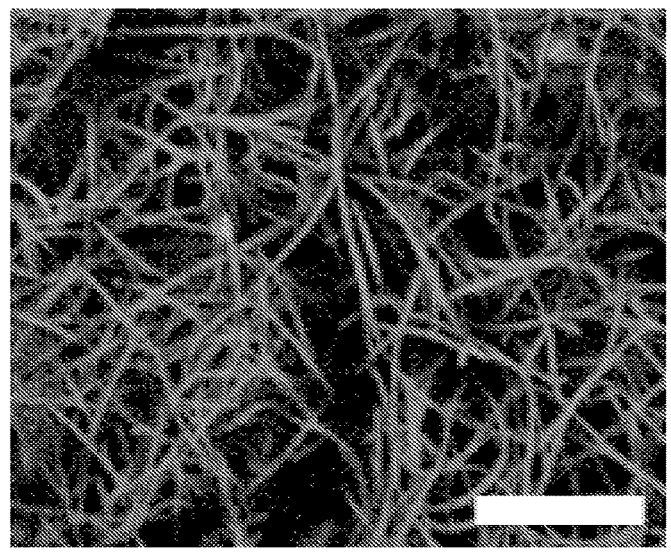
FIG. 2A: Scanning Electron Microscope (SEM) of the semi-conducting CNT network spin-coated on top of the dielectric layer, which form the at least one channel of the FET device. Scale bar: 1 μm.
Figure 2B:
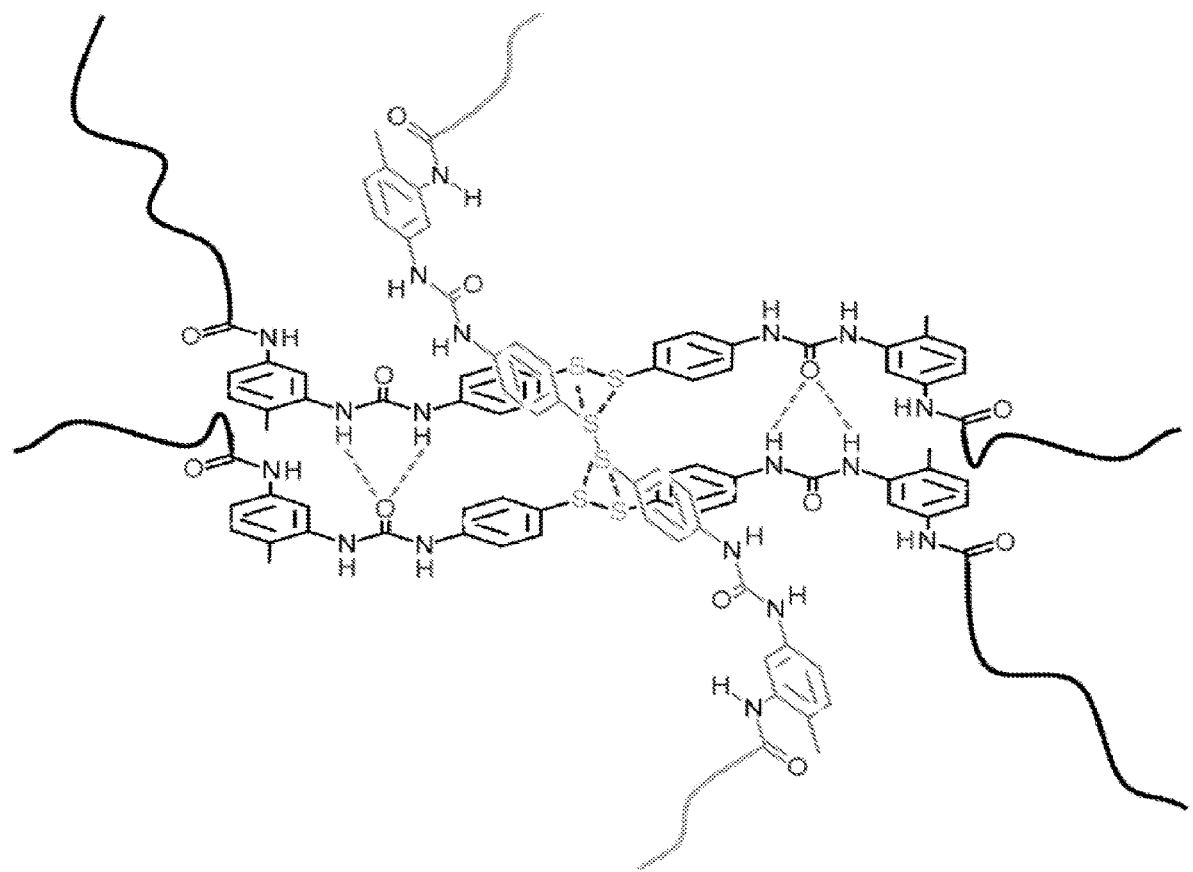
FIG. 2B: Schematic representation of the disulfide-containing PUU polymer structure and crosslinking.

The present invention provides a self-healing field-effect transistor comprising electrically conductive elongated nanostructures as gate, source and drain electrodes, semi-conducting elongated nanostructures as a semi-conducting channel, a self-healing substrate and a self-healing dielectric layer, configured to impart self-healing properties to the FET as a whole.

The present invention is based in part on an unexpected finding that a self-healing dielectric layer can be used in conjunction with semi-conducting elongated nanostructures, including, inter alia, CNTs to form a semi-conducting channel of a self-healing FET, said FET being capable of autonomously recovering from mechanical damage without the aid of external trigger, such as, for example, heat, light, or organic solvent vapor. The present invention, therefore, takes advantage of the combination of the self-healing properties of the dielectric layer and the semi-conducting nature of the CNTs, which are in close contact with said layer, thereby obviating the need for developing or using a single material, which would possess both self-healing and semi-conducting features.

The inventors were able to fabricate an exceptionally thin self-healing dielectric layer, upon which the CNTs are deposited or in which they are embedded, said dielectric layer having long-term mechanical and functional stability despite its low thickness (less than about 10 μm). The intrinsic self-healing ability of the self-healing layer is afforded by a disulfide-containing poly(urea-urethane) (PUU) polymer. In some embodiments, the polymer is composed of two monomers, 4-aminophenyl disulfide (APDS) and poly(propylene glycol) tolylene 2,4-diisocyanate terminated (PPG-TDI), wherein the polymeric chains are connected by dynamic hydrogen and disulfide bonds. The ratio between the APDS and PPG-TDI monomers can be fine-tuned in order to provide a polymer having both the mechanical stability and self-healing ability. It was found that the mass ratios of from about 11:100 to about 13:10 were particularly suitable for the fabrication of the FET of the present invention. The obtained self-healing viscoelastic elastomer was characterized by about 1000% strain and about 0.26 MPa tensile strength at the break-point, as well as high electrical capacitance, thereby enabling the device to turn on at relatively low gate biases, which is highly desirable for wearable electronics.

Source, drain and gate electrodes can conveniently comprise electrically conductive CNTs, ensuring low resistance contact between the CNTs-based semi-conducting channel and source and drain electrodes, further reducing the operating voltages (e.g., below about 8 V) and increasing hole mobility (e.g., being of about 10 $cm^2$ $V^{-1}$ order of magnitude). Additional beneficial feature of the FET device according to the principles of the invention is that a fully functioning device can be composed exclusively of two types of materials, including CNTs and the disulfide-containing PUU polymer, thereby offering ease of production and reducing its cost. The FET device can include metal-based electrodes, such as, for example, AgNWs source, drain and/or gate electrodes. The FET device of the invention can be fabricated by transfer printing, being particularly compatible with self-healing polymers, which allows easy transfer and efficient attachment of the layers.

The self-healing FET device was shown to recover from varying degrees of mechanical damage ranging from microcracks to complete cut of the whole device by scissors, as well as following multiple cycles of mechanical damage. Moreover, the device can be repeatedly stretched for more than 200 cycles of up to 50% strain without a significant loss in its electrical properties thereof. The self-healing and high stretchability of the device enhance its lifetime and autonomic functionality. The FET device of the invention was further employed as a multifunctional sensor that detects temperature and humidity.

The thickness of the self-healing substrate can be adjusted to provide ultrathin FET device, which can be used as an epidermal device (e.g., applied as an ultrathin temporary tattoo to skin). Such ultrathin epidermal sensing devices are promising for in situ analysis of skin chemical and physical environments by modern epidermal applications that facilitate personalized and continuous physiological and clinical investigations.

Thus, according to one aspect, there is provided a self-healing field-effect transistor (FET) device comprising: a self-healing substrate and a self-healing dielectric layer, said substrate and said layer comprising a disulfide-containing poly(urea-urethane) (PUU) polymer, wherein the dielectric layer has a thickness of less than about 10 μm; a gate electrode, at least one source electrode, and at least one drain electrode, said electrodes comprising electrically conductive elongated nanostructures; and at least one channel comprising semi-conducting elongated nanostructures.

The term "electrically conductive", as used herein, refers to a capability of a material to allow the flow of electrons. The term "semi-conducting", is used as known in the art and refers to electrical conductivity of a material being intermediate between a metal and an insulator and depending on applied potential, as well as ambient conditions. Typically, a semiconductor material is a material that has a conductivity of from $10^3$ to $10^{-8}$ Scm$^{-1}$.

According to some embodiments, the gate electrode is self-healing. According to further embodiments, the at least one source electrode and the at least one drain electrode are self-healing. In certain embodiments, each component of the FET device is self-healing.

The term "self-healing", as used herein, refers in some embodiments to the ability of material to spontaneously physically recombine following mechanical damage. According to the principles of the present invention, the self-healing materials and/or components of the FET spontaneously physically recombine following mechanical damage. In further embodiments, the term "self-healing" refers to the ability of material to retain the electrical conductivity, electron mobility and/or hole mobility thereof following mechanical damage. In some embodiments, the self-healing materials and/or components of the FET retain at least about 50% of the electrical conductivity, electron mobility and/or hole mobility thereof following mechanical damage. In further embodiments, the self-healing materials and/or components of the FET retain at least about 60%, 70%, 75%, 80%, 90%, 95%, or 98% of the electrical conductivity, electron mobility and/or hole mobility thereof following mechanical damage. In a certain embodiment, the source and/or drain electrodes retain at least about 50% 60%, 70%, 75%, 80%, 90%, 95%, or 98% of the electrical conductivity thereof following mechanical damage. In another embodiment, the gate electrode retains at least about 50%, 60%, 70%, 75%, 80%, 90%, 95%, or 98% of the electrical conductivity thereof following mechanical damage. In further embodiments, the term "self-healing" refers to the ability of the FET to retain at least one of its characteristic parameters selected from voltage threshold ($V_{th}$), on-current ($I_{on}$), off-current ($I_{off}$), and hole mobility ($\mu_h$) following mechanical damage. In a further embodiment, the FET retains at least about 50%, 60%, 70%, 75%, 80%, 90%, 95%, or 98% of the at least one of its characteristic parameters as outlined hereinabove, following mechanical damage. Each possibility represents a separate embodiment of the invention.

In particular embodiments, the term "self-healing" refers to the ability of the FET to retain the sensitivity thereof in temperature and/or humidity sensing following mechanical damage. In some embodiments, the FET retains at least about 50% of the sensitivity thereof following mechanical damage. In further embodiments, the platform unit retains at least about 60%, 70%, 80%, 90%, 95%, or 98% of the sensitivity thereof following mechanical damage. Each possibility represents a separate embodiment of the invention.

The term "retain" as used in connection with the self-healing ability, refers, in some embodiments, to the restoration of the indicated parameter within less than about 24 hours following the mechanical damage. In further embodiments, the term "retain" refers to the restoration of the indicated parameter within less than about 12 hours, less than about 5 hours, less than about 4 hours, less than about 3 hours, or less than about 2 hours following the mechanical damage. In a certain embodiment, the term "retain" refers to the restoration of the indicated parameter within less than about 1 hour following the mechanical damage.

The term "mechanical damage", as used in some embodiments, refers to a partial or full disassociation between two parts of the material and/or component of the self-healing FET. Mechanical damage applied to or inflicted on the self-healing FET may include, but not limited to, a scratch, a partial cut or a full cut. The term "scratch", as used herein refers to a disassociation depth of up to about 10% of the material and/or component thickness. The term "partial cut", as used herein refers to a disassociation depth of above about 10% but less than 100% of the material and/or component thickness. The term "full cut", as used herein refers to a disassociation depth of 100% of the material and/or component thickness. Mechanical damage can include multiple cycles of mechanical damage. In some embodiments, mechanical damage is caused to the same portion of the FET component during each cycle. In other embodiments, mechanical damage is caused to a different portion of the FET component during each cycle. In additional embodiments, mechanical damage is caused to a different FET component during each cycle. The scratch or cut can be perpendicular or parallel to the channel conduction pathway.

The terms "spontaneous" or "spontaneously", as used herein, refer to the type of process, which does not require application of energy such as, for example, heating, or a promoter, such as, for example, a catalyst, to occur.

In some embodiments, the self-healing FET is an autonomously self-healing device. The term "autonomously", as used herein, refers in some embodiments, to the restoration of the FET and/or its self-healing components or materials without the aid of external trigger, such as, for example, heat, light, or chemical. In further embodiments, the term "autonomously" refers to the restoration of the FET and/or its self-healing components or materials at ambient conditions. In still further embodiments, the term "autonomously" refers to the restoration of the FET and/or its self-healing components or materials without changing operation conditions and/or position of said FET.

The term "epidermal", as used in connection with the FET device, refers in some embodiments to the FET device, which is configured to be placed on and/or attached to human skin; or is placed on and/or attached to human skin.

According to some embodiments, the FET is a free-standing device. The term "free-standing", as used herein, refers in some embodiments to a FET which does not include a substrate made of a material other than the disulfide-containing PUU polymer. In some embodiments, the term "free-standing" refers in to a FET which does not include an additional substrate. In certain embodiments, the FET device consists essentially of the self-healing substrate, the gate electrode, the at least one source electrode, the at least one drain electrode, the self-healing dielectric layer, and the at least one channel, wherein the substrate and the dielectric layer consist essentially of the disulfide-containing PUU polymer, the electrodes consist essentially of the electrically conductive elongated nanostructures, and the channel consists essentially of the semi-conducting elongated nanostructures.

The FET device can have any form as known in the art. According to some embodiments, the FET is in a form selected from the group consisting of a back-gated transistor, top-gated transistor, and vertical transistor. Each possibility represents a separate embodiment of the invention.

In some embodiments, the FET is a back-gated transistor. Typically, back-gated CNTFETs include pre-patterned parallel strips of metal across a silicon dioxide substrate, and semi-conducting CNTs deposited on top in a random pattern. Silicon oxide substrate is used as the gate oxide and adding a metal contact on the back provides a back-gated FET. Such customary FET however suffers from several drawbacks, including the impaired metal—CNTs contact, which is affected by structural and electrical factors, such as Schottky barrier and the high thickness of the back-gate geometry, which makes it difficult to switch the device on and off using low voltages, and the poor contact between the gate dielectric and CNTs. Said drawbacks are overcome by the composition and structure of the FET of the present invention, as mentioned hereinabove. First, the electrode-channel contact is improved by the use of the nanostructured material both for the electrodes and the semi-conducting channel. Second, the FET includes a very thin dielectric layer (having a thickness below about 10 µm), which in combination with said nanostructures-based electrodes and channels allows formation of particularly thin device operable at low voltages.

According to some embodiments, the FET device includes one source electrode, one drain electrode and one channel formed between said source and drain electrodes. In some embodiments, the FET devices comprises a plurality of source and drain electrodes and a plurality of channels formed between the respective source and drain electrodes. Accordingly, in some embodiments, the FET device comprises an array of FETs, wherein each FET includes one source electrode, one drain electrode and one channel formed between said source and drain electrodes.

Reference is now made to FIG. 1A, which schematically shows back-gated FET device 100, according to some embodiments of the invention. FET device 100 includes self-healing substrate 101, gate electrode 103, self-healing dielectric layer 105, plurality of source electrodes 107, plurality of drain electrodes 109, and plurality of channels 111 formed by semi-conducting CNTs 113. Dielectric layer 105 has top surface 105a and bottom surface 105b. Gate electrode 103 is disposed on substrate 101 and contacts bottom side 105b of dielectric layer 105. Plurality of source electrodes 107 and plurality of drain electrodes 109 are disposed on top side 105a of dielectric layer 105. Plurality of source electrodes 107 and plurality of drain electrodes 109 comprise electrically conductive elongated nanostructures (not shown). Semi-conducting CNTs 113 forming plurality of channels 111 are in electric contact with the electrically conductive elongated nanostructures of plurality of source electrodes 107 and plurality of drain electrodes 109. In some embodiments, the semi-conducting CNTs forming the plurality of channels are in electric contact with the plurality of source electrodes and the plurality of drain electrodes. FET device 100 can be seen as comprising an array of FETs, wherein each FET includes source electrode 107, drain electrode 109, and channel 111 formed by semi-conducting CNTs 113. In some embodiments, the side of FET device 100 comprising the plurality of source electrodes 107, drain electrodes 109 and channels 111 is configured to face human, artificial or electronic skin.

Reference is now made to FIG. 13, which shows a magnification of area A of FET device 100, indicated by dotted lines in FIG. 1A including one channel 111 comprising CNTs 113, the channel formed between source electrode 107 and drain electrode 109. Said source electrode 107, drain electrode 109 and CNTs 113 are disposed on dielectric layer 105. Distance L between source electrode 107 and drain electrode 109 is termed "source-drain gap". Distance L is also the length of channel 111, if the area between the source electrode and the drain electrode is sufficiently covered by the CNTs. Distance W between the portions of source electrode 107 and drain electrode 109 indicated by dotted lines is the width of channel 111, if the area between the source electrode and within the dotted lines is sufficiently covered by the CNTs. Gate electrode 103 contacts the bottom side of dielectric layer 105.

In some embodiments, the FET is a top-gated transistor.

Self-Healing PUU-Based Polymer

According to the various aspects and embodiments of the invention, the self-healing substrate and the self-healing dielectric layer of the FET include a disulfide-containing poly(urea-urethane) (PUU) polymer.

Various spontaneously self-healing polymers are known in the art, based, for example, on embedded microencapsulated healing agents, supramolecular self-assembly, transition metal thiolates or aromatic disulfides interactions. The self-healing of such polymers can proceed, inter alia, through dissociation and recombination of dynamic covalent or weak hydrogen bonds at a room temperature. According to some currently preferred embodiments, the disulfide-containing PUU polymer suitable for use in the FET of the invention, is a dynamically covalently crosslinked polymer, which crosslinking bridges comprise disulfide moieties. According to further embodiments, the disulfide-containing PUU polymer is crosslinked through aromatic disulfide moieties. In certain such embodiments, the dynamic crosslinking of the polymeric chains can proceed through the metathesis reaction of aromatic disulfides. In further embodiments, the disulfide-containing poly(urea-urethane) polymer comprises dynamic hydrogen bonds and dynamic disulfide bonds.

The term "crosslinking", as used herein, refers to physical crosslinking formed by entanglements of the polymeric chains. The term "dynamic crosslinking", as used herein, refers to dynamic bonds formed between the polymeric chains, which can be cleaved and spontaneously reformed, creating multiple entanglements in the polymer.

The polymeric chains of the self-healing disulfide-containing PUU polymer should be selected to provide flexibility, mechanical strength, and healability to the substrate and the dielectric layer, while maintaining the thickness of the FET below the desired value. For example, for epidermal sensors, artificial and electronic skins and wearable applications, the FET thickness should not exceed 50 µm, as long as such FET device is mechanically durable. Furthermore, the thickness of the dielectric layer should not exceed 10 µm, in order to provide functioning FET channel with relatively fast switching and low operating voltages.

According to some embodiments, the disulfide-containing PUU polymer comprises an aromatic urethane unit. In some embodiments, the disulfide-containing PUU polymer is a poly(propylene-urethaneureaphenyl-disulfide). In further embodiments, said aromatic urethane unit is tolylene urethane. According to some embodiments, the disulfide-containing poly(urea-urethane) polymer comprises a 4-aminophenyl disulfide (APDS) monomer. In some embodiments, the disulfide-containing poly(urea-urethane) polymer comprises a poly(propylene glycol) tolylene 2,4-diisocyanate terminated (PPG-TDI) monomer. According to particular embodiments, the disulfide-containing poly(urea-urethane) polymer is composed of the APDS monomer and the PPG-TDI monomer. It is to be understood that the end groups of the monomers are changed within the PUU polymer, as the monomers react and urea bonds are formed.

Mechanical stability and self-healing property of the dielectric layer and the substrate of the present invention can be achieved by carefully selecting the mass ratio between the APDS monomer and the PPG-TDI monomer. In some embodiments, the mass of the PPG-TDI monomer is at least 7 times higher than the mass of the APDS monomer. In further embodiments, the mass of the PPG-TDI monomer is at least 7.5 times higher than the mass of the APDS monomer. In still further embodiments, the mass of the PPG-TDI monomer is at least 8 times higher than the mass of the APDS monomer.

In certain embodiments, the mass ratio between the APDS monomer and the PPG-TDI monomer ranges from about 11:100 to about 13:100. In some exemplary embodiments, the mass ratio between the APDS monomer and the PPG-TDI monomer is about 12:100.

According to some embodiments, the disulfide-containing PUU polymer has a glass transition temperature below ambient temperature. According to further embodiments, the disulfide-containing PUU polymer has a glass transition temperature in the range of 0° C. to −60° C. According to some embodiments, the disulfide-containing PUU polymer has a glass transition temperature in the range of −10° C. to −50° C. According to yet further embodiments, the disulfide-containing PUU polymer has a glass transition temperature in the range of −20° C. to −40° C. According to certain embodiments, the disulfide-containing PUU polymer has a glass transition temperature of above about −30° C. According to certain embodiments, the disulfide-containing PUU polymer has a glass transition temperature of about −29° C.

The self-healing substrate can have any desirable shape. As used herein, the term "shape" refers to the geometric dimensions in a Cartesian coordinate three-dimensional system. In rectangular geometries, the length and/or width of the substrate can range between about 0.005 to about 10 cm. The thickness of the substrate can further be tuned, depending on the desired application. In stationary and/or rigid platforms, where the overall thickness of the FET device is not critical, the self-healing substrate can have a thickness as high as 1000 μm. In some embodiments, the self-healing substrate has a thickness of less than about 1000 μm. In further embodiments, the self-healing substrate has a thickness of less than about 500 μm. In still further embodiments, the self-healing substrate has a thickness of less than about 200 μm. In yet further embodiments, the self-healing substrate has a thickness of less than about 100 μm. In still further embodiments, the self-healing substrate has a thickness of less than about 50 μm. In yet further embodiments, the self-healing substrate has a thickness of less than about 20 μm. In some embodiments, the self-healing substrate has a thickness ranging from about 10 μm to about 1000 μm. In further embodiments, the self-healing substrate has a thickness ranging from about 20 μm to about 700 μm, from about 50 μm to about 500 μm, or from about 100 μm to about 200 μm. In some exemplary embodiments, the self-healing substrate has a thickness of about 20 μm.

In skin-related application, and in particular wherein the FET device is configured to be attached directly to human skin (i.e., epidermal applications), the FET device should be ultrathin to obtain good conformal attachment to skin. Accordingly, in some embodiments, the self-healing substrate has a thickness of less than about 10 μm. In further embodiments, the self-healing substrate has a thickness of less than about 5 μm. In still further embodiments, the self-healing substrate has a thickness of less than about 2 μm. In yet further embodiments, the self-healing substrate has a thickness of less than about 1 μm. In still further embodiments, the self-healing substrate has a thickness of less than about 0.5 μm.

In some embodiments, the self-healing substrate has a thickness ranging from about 0.1 μm to about 10 μm. In further embodiments, the self-healing substrate has a thickness ranging from about 0.2 μm to about 5 μm, from about 0.3 μm to about 2 μm, or from about 0.5 μm to about 1 μm. In additional embodiments, the self-healing substrate has a thickness ranging from about 0.1 μm to about 0.5 μm, from about 0.5 μm to about 1 μm, from about 1 μm to about 5 μm, or from about 5 μm to about 10 μm. Each possibility represents a separate embodiment of the invention. In some exemplary embodiments, the self-healing substrate has a thickness of about 1 μm. In some embodiments, the FET device of the invention is configured for use as an epidermal sensor. In additional embodiments the FET device is a part of an epidermal sensing system.

The self-healing dielectric layer can have any desirable shape suitable for the formation of the FET channel thereupon. In rectangular geometries, the length and/or width of the dielectric layer can range between about 0.005 to about 10 cm.

According to the various aspects and embodiments of the present invention, the self-healing dielectric layer has a thickness of less than about 10 μm. In some embodiments, the self-healing dielectric layer has a thickness of less than about 7 μm. In further embodiments, the self-healing dielectric layer has a thickness of less than about 5 μm. In further embodiments, the self-healing dielectric layer has a thickness of less than about 2.5 μm.

In some embodiments, the self-healing dielectric layer has a thickness ranging from about 0.5 μm to about 10 μm. Without wishing to being bound by theory or mechanism of action, it is contemplated that dielectric layer thickness which is higher than about 10 can lead to a decreased performance (e.g., slower switching and higher operating voltages). Dielectric layer thickness of lower than 500 nm can lead to high gate leakages because of the emergence of pinholes and/or defects in the dielectric thin film. In further embodiments, the self-healing dielectric layer has a thickness ranging from about 0.75 to about 7 μm. In still further embodiments, the self-healing dielectric layer has a thickness ranging from about 1 to about 5 μm. In some exemplary embodiments, the self-healing dielectric layer has a thickness of about 2 μm.

According to some embodiments, the self-healing substrate and/or the dielectric layer is substantially flexible. In further embodiments, the FET device is substantially flexible. The term "substantially flexible" as used herein refers to a material, component or device which is configured to elastically deform in response to pressure, wherein said deformation is proportional to the amount of applied pressure.

According to some embodiments, the self-healing substrate and/or the dielectric layer is substantially elastic. In further embodiments, the FET device is substantially elastic. The term "substantially elastic" as used herein refers, in some embodiments, to a material, component or device which is configured to reversibly deform in response to uniaxial strain, such as, for example, stretching and/or compression, wherein the material returns to its original form and size following relaxation of said strain. In further embodiments, the term "substantially elastic" refers to a material, component or device which is configured to retain its electrical properties, such as, for example, electrical conductivity, electron mobility and/or hole mobility following relaxation of uniaxial strain.

According to some embodiments, the self-healing substrate and/or the self-healing dielectric layer are configured to withstand at least about 500% strain and/or about 0.10 MPa tensile strength. According to further embodiments, the self-healing substrate and/or the self-healing dielectric layer are configured to withstand about 1000% strain and/or about 0.26 MPa tensile strength. Each possibility represents a separate embodiment of the invention.

In some embodiments, the self-healing substrate and/or the self-healing dielectric layer are configured to withstand more than 100 cycles of up to 50% uniaxial strain. In further embodiments, the self-healing substrate and/or the self-healing dielectric layer are configured to withstand more than 150 cycles of up to 50% uniaxial strain. In still further embodiments, the self-healing substrate and/or the self-healing dielectric layer are configured to withstand more than 200 cycles of up to 50% uniaxial strain. In some embodiments, the uniaxial strain is applied in parallel to the charge transport direction between the source electrode and the drain electrode. In some embodiments, the uniaxial strain is applied perpendicularly to the charge transport direction between the source electrode and the drain electrode.

In some embodiments, the FET device according to the principles of the present invention is configured to withstand more than 100 cycles of up to 50% uniaxial strain. In further embodiments, the FET device is configured to withstand more than 150 cycles of up to 50% uniaxial strain. In still further embodiments, the FET device is configured to withstand more than 200 cycles of up to 50% uniaxial strain. In certain such embodiments, the FET retains at least about 30% of its initial on-current following strain relaxation. In further embodiments, the FET retains at least about 40% of its initial on-current following strain relaxation. In additional embodiments, the FET retains at least about 25% of its initial off-current following strain relaxation. In further embodiments, the FET retains at least about 35% of its initial off-current following strain relaxation. In some embodiments, the FET retains at least about 30% of its initial hole mobility following strain relaxation. In further embodiments, the FET retains at least about 40% of its initial hole mobility following strain relaxation. In some embodiments, the FET retains less than about 85% of its initial voltage threshold following strain relaxation. In further embodiments, the FET retains less than about 95% of its initial voltage threshold following strain relaxation. In some embodiments, the uniaxial strain is applied in parallel to the charge transport direction between the source electrode and the drain electrode. In some embodiments, the uniaxial strain is applied perpendicularly to the charge transport direction between the source electrode and the drain electrode.

Without wishing to being bound by theory or mechanism of action, it is contemplated that having both strain-dependent and strain-independent parameters is desirable for obtaining a multi-functional FET that can simultaneously detect strain values and other stimuli, e.g. temperature and humidity, without the need for complicated data-processing to separate the responses to each type of stimulus. Thus, the FET according to the principles of the present invention can be further used for the detection of strain. In some embodiments, the FET is used without a pattern learning and recognition analyzer.

Electrodes and Channel

The gate electrode can have any geometrical shape, as known in the art, such as, but not limited to, rectangular shape. In some embodiments, the gate electrode has a length of less than about 2 cm and width of less than about 0.5 cm.

In some embodiments, the gate electrode has a thickness of less than about 500 nm. In further embodiments, the gate electrode has a thickness of less than about 400 nm, less than about 300 nm, less than about 200 nm, less than about 100 nm, or less than about 75 nm.

In some embodiments, the gate electrode has a thickness ranging from about 50 to about 500 nm. In further embodiments, the gate electrode has a thickness ranging from about 75 to about 400 nm. In still further embodiments, the gate electrode has a thickness ranging from about 100 to about 300 nm.

In certain embodiments, the gate electrode consists essentially of the electrically conductive elongated nanostructures embedded within the substrate.

In some embodiments, the combination of the self-healing substrate and the electrically conductive elongated nanostructures of the gate electrode forms a self-healing electrically conductive composite material. In some embodiments, the electrically conductive elongated nanostructures of the gate electrode are deposited onto the substrate. In some currently preferred embodiments, the electrically conductive elongated nanostructures of the gate electrode are embedded within the substrate.

As mentioned hereinabove, the FET device can include a pair of source and drain electrodes (i.e., one source electrode and one drain electrode) or a plurality of pairs of source and drain electrodes. In some embodiments, the FET comprises a plurality of source electrodes and drain electrodes, wherein said electrodes are oriented in parallel to each other and each two source electrodes are separated by a drain electrode. In further embodiments, the number of pairs of source and drain electrodes ranges from 2 to 1000 pairs of electrodes. In further embodiments, the number of pairs of source and drain electrodes ranges from 2 to 100 pairs of electrodes. In still further embodiments, the number of pairs of source and drain electrodes ranges from 2 to 10 pairs of electrodes.

The source and drain electrode within the electrode pair are separated from one another by a source-drain gap. In some embodiments, the source-drain gap distance ranges between about 50 to about 300 μm. In some embodiments, the distance between a source electrode of an electrode paid and a drain electrode of an adjacent electrode pair ranges between about 100 to about 1000 μm.

The at least one source electrode and/or the at least one drain electrode can have any geometrical shape, as known in the art, such as, but not limited to, rectangular or strip shape. In certain embodiments, at least one source electrode and/or the at least one drain electrode comprise a connection pad. In some embodiments, the source electrode and/or the drain electrode has a length of less than about 1 cm and width of less than about 1 mm.

The source and drain electrodes can comprise patterned electrodes, for example, interdigitated electrodes. The interdigitated electrodes can have any shape known in the art, such as, but not limited to rectangular or circular shapes.

In some embodiments, the at least one source electrode and/or the at least one drain electrode has a thickness of less than about 500 nm. In further embodiments, the at least one source electrode and/or the at least one drain electrode has a thickness of less than about 400 nm, less than about 300 nm, less than about 200 nm, less than about 100 nm, or less than about 75 nm. Each possibility represents a separate embodiment of the invention.

In some embodiments, the at least one source electrode and/or the at least one drain electrode has a thickness ranging from about 50 to about 500 nm. In further embodiments, the at least one source electrode and/or the at least one drain electrode has a thickness ranging from about 75 to about 400 nm. In still further embodiments, the at least one source electrode and/or the at least one drain electrode has a thickness ranging from about 100 to about 300 nm.

In some embodiments, the combination of the self-healing dielectric layer and the electrically conductive elongated nanostructures of the at least one source electrode and/or the at least one drain electrode forms a self-healing electrically conductive composite material. In some embodiments, the electrically conductive elongated nanostructures of the at least one source electrode and/or the at least one drain electrode are deposited onto the dielectric layer. In some currently preferred embodiments, the electrically conductive elongated nanostructures of the at least one source electrode and/or the at least one drain electrode are embedded within the dielectric layer.

In certain embodiments, the at least one source electrode and/or the at least one drain electrode consists essentially of the electrically conductive elongated nanostructures embedded within the dielectric layer.

Shape of the at least one FET channel is defined by the shape and position of the at least one source and at least one drain electrodes, and the position of the semi-conducting elongated nanostructures, which form said at least one channel. In some embodiments, the FET channel has a length of less than about 500 µm and width of less than about 2 cm. In further embodiments, the FET channel has a length of less than about 500 µm and width of less than about 1 cm. In yet further embodiments, the FET channel has a length of less than about 300 µm and width of less than about 1 cm. In still further embodiments, the FET channel has a length of about 200 µm and width of about 5000 µm. The term "length" as used herein in connection with the FET channel refers to the source-drain gap distance, wherein said source-drain gap is covered by the semi-conducting elongated nanostructures. The term "width" as used herein in connection with the FET channel refers to the length of the portion of the source electrode and the drain electrode within the source-drain electrode pair, said electrode portion being in contact with the semi-conducting elongated nanostructures.

In some embodiments, the channel of the FET has a thickness of less than about 50 nm. In further embodiments, the channel of the FET has a thickness of less than about 40 nm. In some exemplary embodiments, the channel of the FET has a thickness of less than about 30 nm.

According to some embodiments, the semi-conducting elongated nanostructures are arranged in a random network configuration. In some embodiments, the combination of the self-healing dielectric layer and the semi-conducting elongated nanostructures of the channel forms self-healing semi-conducting composite material. According to some embodiments, the semi-conducting elongated nanostructures of the channel are deposited onto the at least one source electrode, the at least one drain electrode, and the self-healing dielectric layer. According to some embodiments, the semi-conducting elongated nanostructures of the channel are embedded within the dielectric layer.

The term "elongated nanostructures", as used herein, refers in some embodiments, to a structure having at least one dimension in a nanometer range and an aspect ratio (length to width) of at least about 2:1. In some embodiments, the elongated nanostructure has an aspect ratio of about 5:1, about 10:1, about 50:1, or about 100:1. Each possibility represents a separate embodiment of the invention.

The elongated nanostructures can be selected from nanotubes, nanowires, nanoribbons, nano-whiskers, nanostrips, and nanorods. Each possibility represents a separate embodiment of the invention.

In some embodiments, the electrically conductive nanostructures are made of carbon. The term "carbon", as used herein, is meant to encompass various allotropes of carbon, including, inter alia, amorphous carbon, graphene and fullerene. In some embodiments, the electrically conductive elongated nanostructures comprise graphene nanoribbons. In some exemplary embodiments, the electrically conductive elongated nanostructures comprise carbon nanotubes.

In additional embodiments, the electrically conductive elongated nanostructures are made of metal or metal alloy. Non-limiting examples of suitable metals include Ag, Au, Ti, Cu, Pd, Pt, Ni, and Al. Each possibility represents a separate embodiment of the invention. In certain embodiments, said metal is Ag. In some related embodiments, the electrically conductive elongated nanostructures comprise metallic nanowires.

The term "nanowire" is meant to encompass nanostructures having a narrow cross-section, e.g., less than 100 nm and an aspect ratio that is greater than about 5:1. In other words, nanowires are generally elongated by at least five times along an axis with respect to other perpendicular axes. The term "nanowire" does not imply that the structure must be wire-like, only that the structure is elongated along one of its axes. For example, structures that are wire-like, tubular, rope-like, or belt-like are considered to be nanowires.

In certain embodiments, the electrically conductive elongated nanostructures are selected from gold nanowires and silver nanowires. In some exemplary embodiments, the electrically conductive elongated nanostructures comprise silver nanowires.

In some embodiments, the semi-conducting nanostructures are made of carbon or silicon. In some embodiments, the semi-conducting nanostructures are made of graphene. In some embodiments, the semi-conducting nanostructures are made of fullerene.

Non-limiting examples of suitable semi-conducting elongated nanostructures include carbon nanotubes, silicon nanowires, graphene nanoribbons, and fullerene nanorods. In some currently preferred embodiments, the semi-conducting elongated nanostructures comprise carbon nanotubes.

The electrically conductive carbon nanotubes suitable for use in the gate electrode, at least one source electrode, and/or at least one drain electrode can be selected from single walled carbon nanotubes (SWCNTs) and multi walled carbon nanotubes (MWCNTs). In certain embodiments, the carbon nanotubes are SWCNTs. In some particular embodiments, the gate electrode, at least one source electrode, and/or at least one drain electrode consists essentially of SWCNTs.

The semi-conducting carbon nanotubes suitable for use in the at least one channel of the FET can include SWCNTs. In some particular embodiments, the at least one channel consists essentially of SWCNTs.

The term "single walled carbon nanotube", as used herein, refers to a cylindrically shaped thin sheet of carbon atoms having a wall which is essentially composed of a single layer of carbon atoms which are organized in a hexagonal crystalline structure with a graphitic type of bonding. A nanotube is characterized by the length-to-diameter ratio. It is to be understood that the term "nanotubes" as used herein refers to structures in the nanometer as well as micrometer range.

According to various embodiments, the single-walled carbon nanotubes suitable for use in the FET device of the present invention have diameters ranging from about 0.6 nanometers (nm) to about 2.5 nm and lengths ranging from about 50 nm to about 100 micrometers (µm). More preferably, the single-walled carbon nanotubes have diameters ranging from about 0.7 nm to about 2.4 nm and lengths ranging from about 100 nm to about 50 µm. Even more preferably, the single-walled carbon nanotubes have diameters ranging from about 0.8 nm to about 2.3 nm and lengths ranging from about 250 nm to about 25 µm. According to some embodiments, the single-walled carbon nanotubes have diameters ranging from about 0.9 nm to about 2.2 nm and lengths ranging from about 0.5 μm to about 10 μm. In certain embodiments, the single-walled carbon nanotubes of the present invention have diameters ranging from about 1 nm to about 2 nm and lengths ranging from about 1 μm to about 6 μm.

In some embodiments, the SWCNTs have purity of at least about 70% wt. In further embodiments, the SWCNTS have purity of at least about 75% wt., at least about 80% wt., at least about 90% wt., at least about 95% wt., or at least about 99% wt. Each possibility represents a separate embodiment of the invention. In some particular embodiments, the electrically conductive SWCNTS suitable for use in the gate electrode, at least one source electrode, and/or at least one drain electrode has purity of at least about 75% wt. In some other particular embodiments, the semi-conducting SWCNTS suitable for use in channel have purity of at least about 99% wt.

In some embodiments, the semi-conducting SWCNTs suitable for use in the at least one channel of the FET has a semiconducting content of at least about 90%. In further embodiments, said SWCNTs have a semiconducting content of at least about 95%. In still further embodiments, said SWCNTs have a semiconducting content of at least about 99%. In further embodiments, said semi-conducting SWCNTs are p-type semiconducting SWCNTs.

In some embodiments, the electrically conductive SWCNTs suitable for use in the gate electrode, at least one source electrode, and/or at least one drain electrode of the FET has a semiconducting content of less than about 70%.

Additional Components of the Self-Healing FET

The FET device according to the principles of the present invention, can further include additional components (e.g., layers), to assist in the handling and/or operation of the FET device. Said additional layers can include, inter alia, protecting, supporting, and connecting layers.

According to some embodiments, the FET device further comprises at least one elastic layer. Said elastic layer can be beneficial when handling an epidermal ultrathin FET device, according to some embodiments of the invention. Additionally, said elastic layer can serve as a protecting layer, separating the device from skin of a user.

In some embodiments, the elastic layer comprises a polymer. The type of the elastic layer can be chosen to provide support during handling or during operation of the FET device. Accordingly, a polymer suitable for use in the elastic layer should be capable of providing mechanically stable and durable films, while being stretchable and preferably self-healing. Non-limiting examples of polymers suitable for use in the elastic layer include polystyrene-block-polyisoprene-block-polystyrene (PS-b-PI-b-PS, also abbreviated herein as "PS-PI-PS"), PDMS, polybutadiene rubber, polyisoprene rubber, elastic polyurethane, and thermoplastic polyurethane elastomer. In certain embodiments, the elastic layer is made of PS-b-PI-b-PS.

In some embodiments, the FET device is disposed on said elastic layer. In further embodiments, the elastic layer contacts the self-healing substrate.

In some embodiments, the elastic layer substantially covers the FET device. In further embodiments, the elastic layer contacts the at least one channel, the at least one source electrode and/or the at least one drain electrode.

The shape and size of the elastic layer can be the same as the shape and size of the self-healing substrate. In some embodiments, the size of the elastic layer is larger than the size of the self-healing substrate. In other embodiments, the size of the elastic layer is smaller than the size of the self-healing substrate. The thickness of the elastic layer can range from about 1 μm to about 5 mm. In some embodiments, the thickness of the elastic layer ranges from about 50 μm to about 2 mm. In further embodiments, the thickness of the elastic layer ranges from about 100 μm to about 1 mm. In certain embodiments, the thickness of the elastic layer is about 500 μm.

In some embodiments, the FET device comprises an elastic layer contacting the self-healing substrate. In some embodiments, the FET device comprises a first elastic layer contacting the self-healing substrate and a second elastic layer contacting the at least one source electrode, the at least one drain electrodes and the at least one channel. In certain such embodiments, the second elastic layer serves as a protecting layer of the FET device.

In some embodiments, the FET device comprises a protecting layer. The protecting layer can be used to separate the nanomaterial-based electrodes and channel from the surface which is in contact with the FET device, such as, but not limited to, user skin. The protecting layer can thus be used to prevent the contact of the device with sweat and/or volatile organic compounds excreted from human skin. The protecting layer can be further used for reduction of the effects caused by the external environment (e.g. humidity and/or temperature). Additionally or alternatively, the protecting layer can be used to assist self-healing of the FET device following mechanical damage. In some embodiments, the protecting layer comprises an elastic layer, as described hereinabove.

In some embodiments, the protecting layer is flexible. In some embodiments, the protecting layer comprises a polymer. Non-limiting examples of polymers suitable for use in the protecting PDMS, SBS, SEBS, PS-PI-PS, polybutadiene rubber, polyisoprene rubber, elastic polyurethane, and thermoplastic polyurethane elastomer. In certain embodiments the protecting layer comprises PDMS.

In some embodiments, the protecting layer contacts the elastic layer. Accordingly, the protecting layer can be disposed on the top or on the bottom side of the FET.

In some embodiments, the FET device comprises a protecting layer contacting the self-healing substrate. In some embodiments, the FET device comprises an elastic layer contacting the self-healing substrate and a protecting layer contacting the at least one source electrode, the at least one drain electrode and the at least one channel. In some embodiments, the FET device comprises an elastic layer contacting the at least one source electrode, the at least one drain electrode and the at least one channel and a protecting layer contacting said elastic layer.

The shape and size of the protecting layer can be the same as the shape and size of the self-healing substrate and/or the elastic layer. In some embodiments, the size of the protecting layer is larger than the size of the self-healing substrate and/or the elastic layer. In other embodiments, the size of the protecting layer is smaller than the size of the self-healing substrate and/or the elastic layer. The thickness of the protecting layer can be as low as 50 nm.

Figure 3:
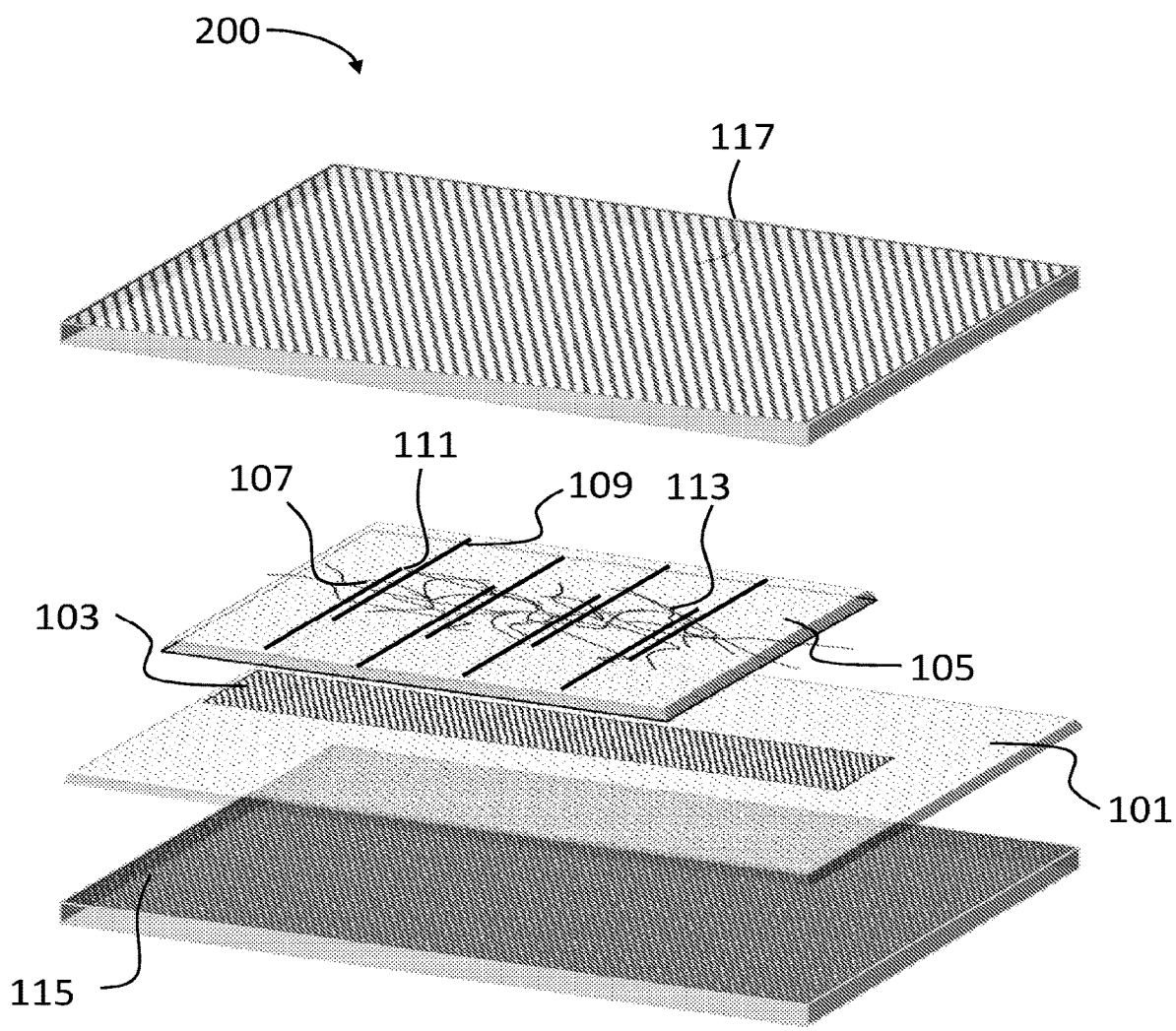
FIG. 3: Schematic exploded view representation of the FET device comprising a self-healing substrate, a self-healing dielectric layer, a gate electrode, a plurality of source and drain electrodes, a plurality of channels, an elastic layer, and a protecting layer, in accordance with some embodiments of the invention.

Reference is now made to FIG. 3, which schematically shows an exploded view of back-gated FET device 200, according to some embodiments of the invention. FET device 200 includes self-healing substrate 101, gate electrode 103, self-healing dielectric layer 105, plurality of source electrodes 107, plurality of drain electrodes 109, and plurality of channels 111 formed by semi-conducting CNTs 113. FET device 200 further comprises elastic layer 115 and protecting layer 117. Protecting layer 117 is the top layer of FET device 200. Protecting layer 117 contacts plurality of source electrodes 107, plurality of drain electrodes 109, and semi-conducting CNTs 113. Elastic layer 115 is the bottom layer of FET device 200. Elastic layer 115 contacts self-healing substrate 101. Elastic layer 115 and protecting layer 117 can be made of a same or a different material.

According to some embodiments, the FET further comprises a backing layer. Said backing layer can be effectively used when handling an epidermal ultrathin FET device, according to some embodiments of the invention. Additionally, said backing layer can be used to facilitate the attachment of the device to the desired surface. In some embodiments, the backing layer is configured to be removed following the attachment of the FET device to the desired surface.

In some embodiments, the backing layer is flexible. The backing layer can include, inter alia, a thin paper, a tough paper or a smooth fabric. In some embodiments, the backing layer comprises a polymer. Non-limiting examples of materials suitable for use in the backing layer include cellulose, PET, Kapton, PEN and combinations and derivatives thereof.

The shape and size of the backing layer can be the same as the shape and size of the self-healing substrate, the protecting layer, and/or the elastic layer. In some embodiments, the size of the backing layer is larger than the size of the self-healing substrate, the protecting layer and/or the elastic layer. In other embodiments, the size of the backing layer is smaller than the size of the self-healing substrate, the protecting layer and/or the elastic layer. The thickness of the backing layer can range from about 1 to about 1000 μm.

In some embodiments, the backing layer substantially covers the FET device. In some embodiments, the backing layer contacts the self-healing substrate.

In some embodiments, the FET device comprises a backing layer contacting the self-healing substrate, an elastic layer, contacting the at least one source electrode, the at least one drain electrode and the at least one channel, and a protecting layer contacting the elastic layer.

In some embodiments, the FET further comprises an adhesive layer. The adhesive layer can be used to attach the FET to a desired surface, such, as, for example, skin or garment.

In some embodiments, the adhesive layer comprises a polymer. In some embodiments, the adhesive layer is a sacrificial layer. In some embodiments, the polymer of the adhesive layer is water-soluble to allow its easy removal following attachment of the FET to the desired surface. Non-limiting examples of polymers suitable for use in the adhesive layer include PVA, PEI and PEG.

In some embodiments, the adhesive layer contacts the elastic layer. Accordingly, the adhesive layer can be disposed on the top or on the bottom side of the FET device.

The shape and size of the adhesive layer can be the same as the shape and size of the self-healing substrate and/or the elastic layer. In some embodiments, the size of the adhesive layer is larger than the size of the self-healing substrate and/or the elastic layer. In other embodiments, the size of the adhesive layer is smaller than the size of the self-healing substrate and/or the elastic layer. The thickness of the adhesive layer can range from about 200 nm to about 1000 nm.

In some embodiments, the thickness of the FET is less than about 5 mm. In further embodiments, the thickness of the FET device is less than about 1 mm. In still further embodiments, the thickness of the FET device is less than about 500 μm. In yet further embodiments, the thickness of the FET device is less than about 100 μm. In still further embodiments, the thickness of the FET device is less than about 50 μm. In yet further embodiments, the thickness of the FET device is less than about 10 μm.

In some embodiments, the FET device has a thickness ranging from about 0.7 μm to about 7 mm. In further embodiments, the FET device has a thickness ranging from about 1 μm to about 5 mm. In still further embodiments, the FET device has a thickness ranging from about 5 μm to about 1 mm. In yet further embodiments, the FET device has a thickness ranging from about 10 μm to about 500 μm.

In additional embodiments, the FET device has a thickness ranging from about 0.7 μm to about 100 μm. In additional embodiments, the FET device has a thickness ranging from about 0.8 μm to about 50 μm. In further embodiments, the FET device has a thickness ranging from about 0.9 μm to about 10 μm. In still further embodiments, the FET device has a thickness ranging from about 1 μm to about 5 μm. In some exemplary embodiments, the thickness of the FET device is about 2 μm. In certain such embodiments, the FET device does not include the elastic layer, the protecting layer and the backing layer.

The thickness of the FET device can be measured between the bottom side of the self-healing substrate and at least one of the source electrode, drain electrode and channel. When the FET device comprises the elastic layer, the protecting layer, and/or the backing layer, the thickness of the FET device can be measured between the bottom side of the elastic layer, which contacts the self-healing substrate and at least one of the source electrode, drain electrode and channel. In some embodiments, the thickness of the FET device is measured between the bottom side of the first elastic layer, which contacts the self-healing substrate and the top side of the second elastic layer, which contacts the source electrode, drain electrode and/or channel. In additional embodiments, the thickness of the FET device is measured between the bottom side of the backing layer, which contacts the self-healing substrate and the top side of the protective layer which is disposed on top of the FET device.

Temperature and Humidity Detection

The FET device according to the principles of the invention is configured to provide the detection of physical, as well as, chemical stimuli, including, inter alia, temperature and humidity. Said physical or chemical stimuli can come from the FET environment or from the surface to which the FET is attached. For example, when used as an epidermal sensor, the FET device can provide the detection of human body temperature and/or skin humidity.

In some embodiments, the FET device is configured to detect temperature. In some embodiments, the FET is configured to detect temperature ranging from about −10° C. to about 80° C. In further embodiments, the FET device is configured to detect temperature ranging from about 0° C. to about 60° C. In still further embodiments, the FET is configured to detect temperature ranging from about 0° C. to about 30° C. According to certain embodiments, the FET device is particularly suitable for the detection of temperature at room conditions. According to certain embodiments, the FET device is configured for the detection of human body temperature.

Without wishing to being bound by theory or mechanism of action, it is contemplated that temperature detection is afforded by temperature-dependent conductivity of CNTs, swelling/deswelling of the self-healing polymer, temperature-dependent capacitance of the dielectric layer, and any combination thereof.

According to some embodiments, the FET device is for use in the temperature sensing.

According to an aspect of the invention, there is provided a method of temperature sensing, comprising providing the FET according to the various embodiments listed hereinabove. In some embodiments, the method further comprises disposing the FET device on a target surface, which temperature needs to be measured and/or monitored. In certain embodiments, said surface is selected from human skin, artificial or electronic skin or garment. In further embodiments, the method comprises connecting the FET device to a detection device, as explained hereinbelow.

In some embodiments, the FET device is configured to detect humidity. In some embodiments, the FET device is configured to detect skin hydration levels. In certain embodiments, the FET device is configured to detect humidity ranging from about 1% to about 100% relative humidity (RH).

Without wishing to being bound by theory or mechanism of action, it is considered that the sulfide-containing PUU polymer, which forms the dielectric layer and the substrate of the FET device, is highly affected by humidity. It is further assumed that water molecules can be absorbed in the sulfide-containing PUU polymer or desorbed therefrom, thereby leading to changes in the elasticity and capacitance of the polymer. Said change in elasticity and/or conductivity can give an indication as to the hydration levels of the skin which is in contact with the polymer. Changes in the capacitance of the dielectric directly affect the parameters of the FET as lower/higher gate voltages are required to switch the FET on. Specifically, higher currents and lower $V_{th}$ are obtained with increasing the humidity.

According to some embodiments, the FET device is for use in the humidity sensing.

According to an aspect of the invention, there is provided a method of humidity sensing, comprising providing the FET according to the various embodiments listed hereinabove. In some embodiments, the method further comprises disposing the FET device on a target surface, which humidity needs to be measured and/or monitored. In certain embodiments, said surface is selected from human skin, artificial or electronic skin or garment. In further embodiments, the method comprises connecting the FET device to a detection device, as explained hereinbelow.

In some embodiments, the FET device has dual sensing sensitivities, such as dual temperature and humidity sensitivity. One of skill in the art readily understands that a signal generated by each parameter (temperature or humidity) can be extracted using pre-measurement calibration, post-measurement calculation or a combination thereof.

As mentioned hereinabove, in some embodiments, the FET device is characterized by sensing sensitives, which are both strain-dependent and strain-independent. The different sensitivity of the measured parameters to strain can beneficially be used to decouple the response to temperature and/or humidity changes from the response to stretching and/or compression of the FET device. In further embodiments, the FET is configured to detect strain. In certain embodiments, said strain is uniaxial strain.

According to some embodiments, the FET device retains it sensing ability following mechanical damage. It was shown by the inventors of the present invention that the FET device retained about 100% of its initial temperature and humidity sensitivity following recovery from mechanical damage. Accordingly, in some embodiments, the FET device retains at least about 80% of its sensing ability following mechanical damage. In additional embodiments, the FET device retains at least about 90% of its sensing ability or at least about 95% of its sensing ability following mechanical damage.

FET Signal Measurement and Analyzing Devices

The signal generated by the FET device in response to the change in temperature and/or humidity, can be detected by a suitable detection device. Thus, in some embodiments, the FET device is coupled to the signal detection and/or measuring device. In some embodiments, the FET device is coupled to a detection device for measuring a change in at least one property of the at least one drain electrode, at least one source electrode, gate electrode, or any combination thereof. Suitable detection and/or measuring devices should be susceptible to a change in any one or more of conductance, mobility, electrical potential, and voltage threshold. Each possibility represents a separate embodiment of the present invention. Changes in the electric properties of the sensor, such as conductance, electrical potential, or voltage threshold can be measured by any suitable device known in the art, including, inter alia, a data logger, a potentiostat, a voltmeter, a conductivity meter, an LCR meter or a millimeter. Changes in the hole mobility of the FET can be extracted from the transfer curves of the transistor in the saturation regime using Equation (I):

$$I_{ds} = \frac{\mu C_i W}{2L}(V_g - V_{th})^2, \quad \text{Equation (I)}$$

where $I_{ds}$ is the drain current in the saturated regime, $C_i$ is the dielectric capacitance per unit area, W and L are the wide and length of the FET channel, respectively, $V_g$ and $V_{th}$ are the threshold gates and voltages, respectively. Additionally, voltage threshold ($V_{th}$) was calculated by extrapolating the linear fit of $(|I_{ds}|)^{1/2}$ vs. $V_g$ plot to $(|I_{ds}|)^{1/2}=0$. The measured signals can be displayed on a display or transmitted to a host computer.

When FET devices having dual sensing sensitivities or an array of FETs are used, the signals obtained from the one or more FETs can be analyzed by a computing system configured for executing various algorithms stored on a non-transitory memory. Thus, according to some embodiments, the FET device is coupled to said computing system. The algorithms can include learning and pattern recognition algorithms, such as, but not limited to, artificial neural network (ANN) algorithm, support vector machine (SVM), discriminant function analysis (DFA), principal component analysis (PCA), multi-layer perception (MLP), generalized regression neural network (GRNN), fuzzy inference system (FIS), self-organizing map (SOM), radial bias function (RBF), genetic algorithm (GAS), neuro-fuzzy system (NFS), adaptive resonance theory (ART), partial least squares (PLS), multiple linear regression (MLR), principal component regression (PCR), linear discriminant analysis (LDA), cluster analysis, nearest neighbor, Fisher linear discriminant analysis (FLDA), soft independent modeling of class analogy (SIMCA), K-nearest neighbors (KNN), genetic algorithms, and fuzzy logic algorithms and canonical discriminant analysis (CDA).

Self-Healing Platform Unit Fabrication Procedure

The FET according to the various embodiments of the present invention can be fabricated as known in the art, for example by 3D printing, since the precursor materials are solution-processable, enabling high-throughput production.

According to an aspect and various embodiments of the present invention, the FET device is fabricated by transfer printing. Without wishing to being bound by theory or mechanism of action, it is postulated that transition printing is convenient for use with self-healing polymers because of their natural healing ability, which makes for easy transfer and great attachment of the layers of the device. It should be noted that said method enables fabrication of epidermis-like FET devices, which can be easily transferred to human skin.

The transfer printing method for fabricating the FET device includes the following steps: (a) applying a liquid dispersion comprising electrically conductive elongated nanostructures onto a rigid substrate, thereby forming the gate electrode; (b) applying a solution comprising the disulfide-containing PUU polymer or prepolymer on top of the gate electrode, thereby forming the self-healing substrate; (c) transferring the gate electrode and the self-healing substrate to a flexible substrate, wherein the self-healing substrate contacts the flexible substrate; (d) applying the liquid dispersion comprising electrically conductive elongated nanostructures onto a rigid substrate, thereby forming the at least one source electrode and the at least one drain electrode; (e) applying the solution comprising the disulfide-containing PUU polymer or prepolymer on top of the at least one source electrode and the at least one drain electrode, thereby forming the self-healing dielectric layer; (f) transferring the at least one source electrode, the at least one drain electrode, and the dielectric layer to the gate electrode, wherein the dielectric layer contacts the gate electrode; and (g) applying a liquid dispersion comprising semi-conducting elongated nanostructures onto the at least one source electrode and the at least one drain electrode, thereby forming the at least one channel.

Figure 4A:
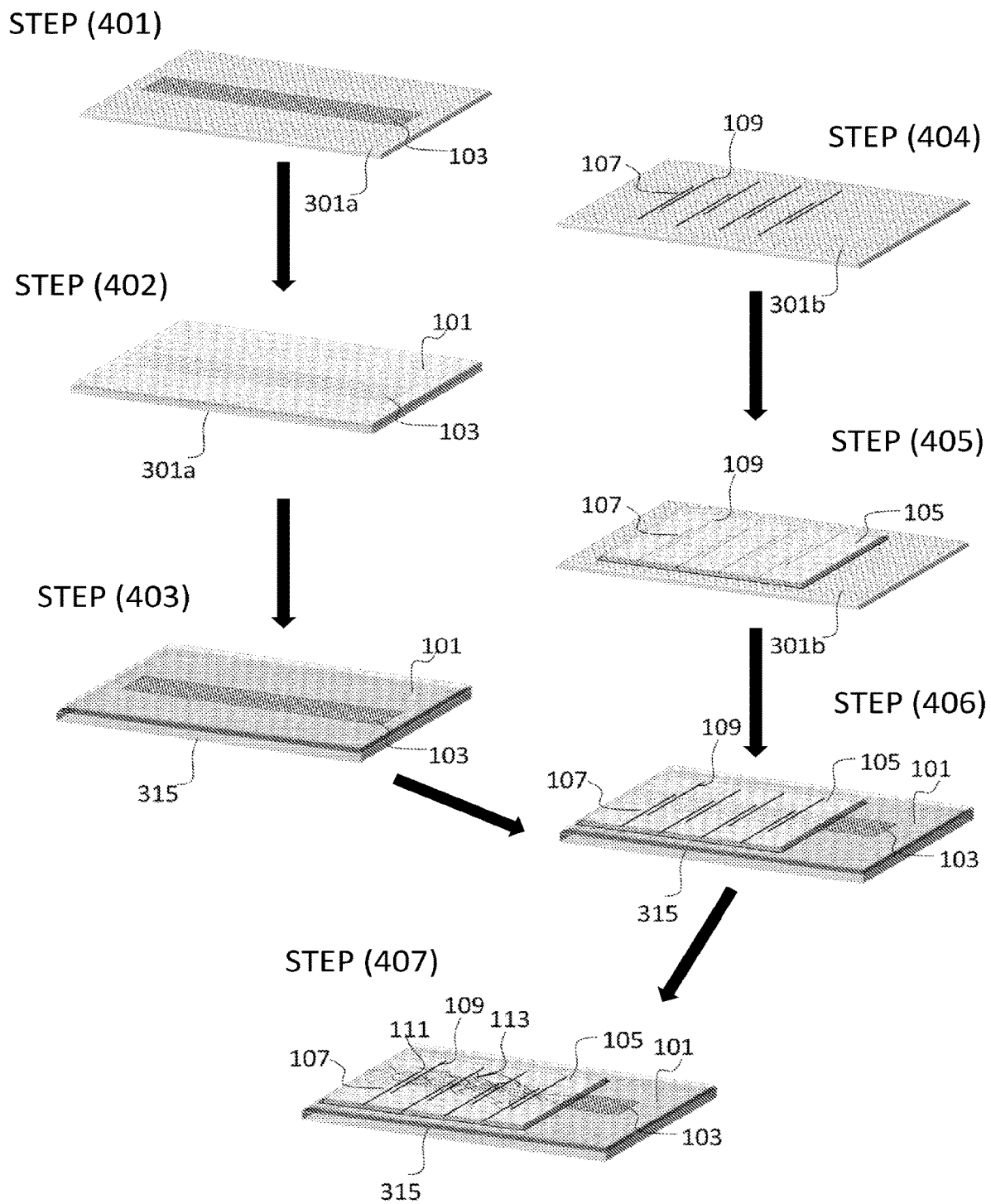
FIG. 4A: Schematic representation of the steps of the fabrication method of the FET device in accordance with some embodiments of the invention.
Figure 4B:
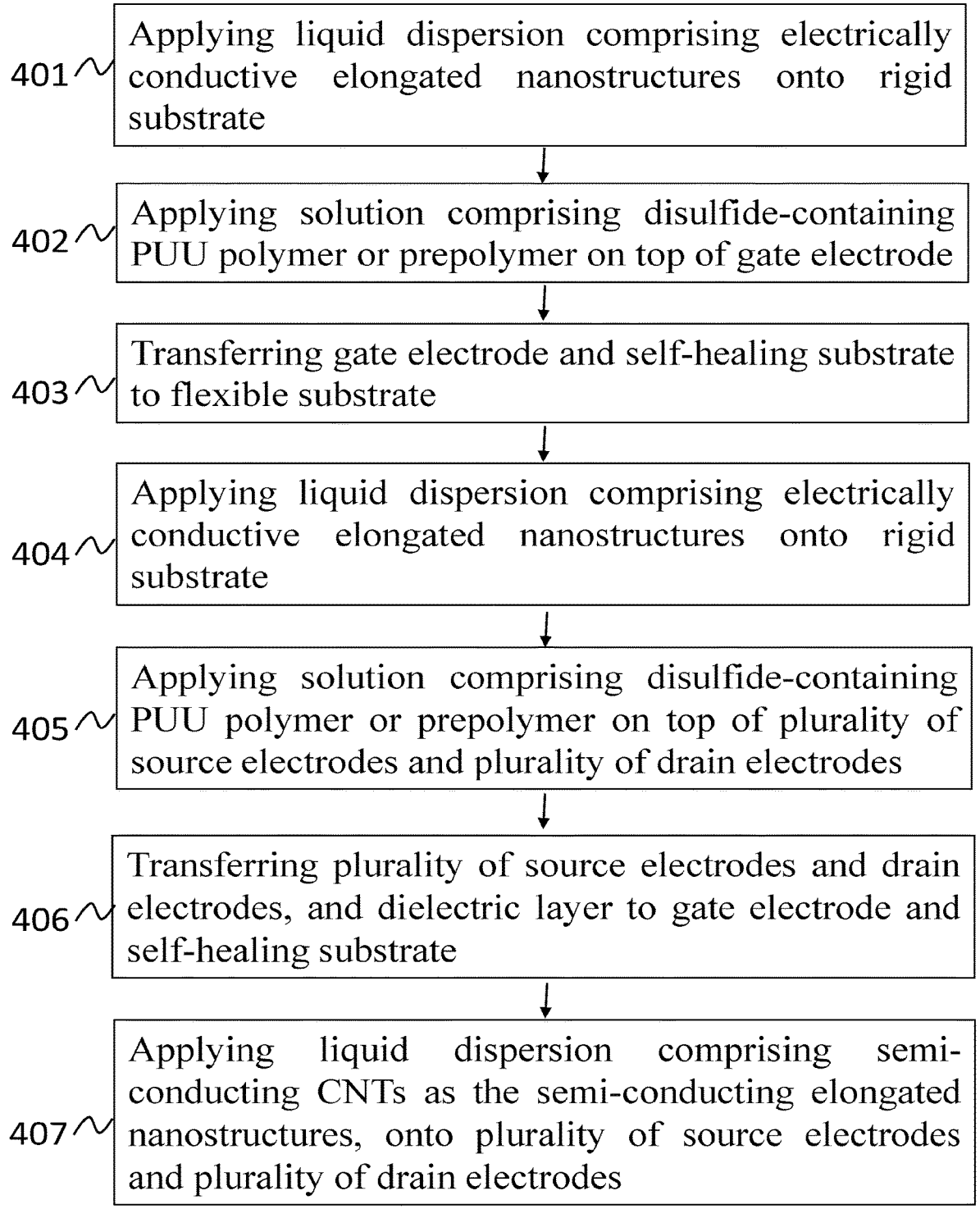
FIG. 4B: Flow chart of an exemplary method of transfer printing, in accordance with some embodiments of the invention.

Reference is now made to FIG. 4A, which schematically illustrates the transfer printing method according to some embodiments of the invention, said method including steps [401]-[407] corresponding to steps (a)-(g) hereinabove and to FIG. 4B, which schematically illustrates a flow chart of an exemplary method of transfer printing, in accordance with some embodiments of the invention.

Step [401] includes applying a liquid dispersion comprising electrically conductive elongated nanostructures onto rigid substrate 301a, thereby forming gate electrode 103.

Step [402] includes applying a solution comprising the disulfide-containing PUU polymer or prepolymer on top of gate electrode 103, thereby forming self-healing substrate 101.

Step [403] includes transferring gate electrode 103 and self-healing substrate 101 to flexible substrate 315. Gate electrode 103 and self-healing substrate 101 composite is transferred to flexible substrata 315 such that the self-healing substrate contacts the flexible substrate.

Step [404] includes applying the liquid dispersion comprising electrically conductive elongated nanostructures onto rigid substrate 301b, thereby forming plurality of source electrodes 107 and plurality of drain electrodes 109.

Step [405] includes applying the solution comprising the disulfide-containing PUU polymer or prepolymer on top of plurality of source electrodes 107 and plurality of drain electrodes 109, thereby forming self-healing dielectric layer 105.

Step [406] includes transferring plurality of source electrodes 107, plurality of drain electrodes 109, and dielectric layer 105 to gate electrode 103 and self-healing substrate 101. Source electrodes 107, drain electrodes 109, and self-healing dielectric layer 105 composite is transferred to gate 103 and self-healing substrate 101 composite such that the dielectric layer contacts the gate electrode.

Step [407] includes applying a liquid dispersion comprising semi-conducting CNTs 113 as the semi-conducting elongated nanostructures, onto plurality of source electrodes 107 and plurality of drain electrodes 109, thereby forming plurality of channels 111. Semi-conducting CNTs 113 also contact self-healing dielectric layer 105.

Steps [401] and [402] can be performed concurrently with steps [404] and [405], respectively.

The steps of applying the liquid dispersion comprising electrically conductive elongated nanostructures (steps [401] and [404]) can be performed by any suitable process as known in the art. Non-limiting examples of said application processes include spraying, dip-coating, spin-coating, drop-casting, field enhanced deposition, soft lithography, inkjet printing, screen printing and combinations thereof. In some exemplary embodiments, the electrically conductive elongated nanostructures are applied by spraying.

As mentioned hereinabove, the source and drain electrodes, as well as the gate electrode, can have a specific shape. Accordingly, in some embodiments, the steps of applying the liquid dispersion comprising electrically conductive elongated nanostructures (steps [401] and [404]) comprise applying the dispersion to form a predetermined pattern. The predetermined pattern can be formed by applying a mask to the surface of the rigid substrate and applying the liquid dispersion to the remaining bare surface of the substrate, uncovered by the mask. In additional embodiments, the predefined pattern is controlled by the printing machine or equipment, such a printer or a screen.

The elongated nanostructures in the liquid dispersion can be made of metal, metal alloy, silicon or carbon and can have various forms, as detailed hereinabove. According to some embodiments, the liquid dispersion comprising electrically conductive elongated nanostructures is an aqueous dispersion. The concentration of the electrically conductive elongated nanostructures in the aqueous dispersion can range from about 0.1 mg/ml to about 50 mg/ml. In some embodiments, the concentration of the electrically conductive elongated nanostructures in the aqueous dispersion ranges from about 0.1 mg/ml to about 10 mg/ml. In further embodiments, the concentration of the electrically conductive elongated nanostructures in the aqueous dispersion ranges from about 0.5 mg/ml to about 5 mg/ml. In additional embodiments, the concentration of the electrically conductive elongated nanostructures in the aqueous dispersion ranges from about 1 mg/ml to about 20 mg/ml. In further embodiments, the concentration of the electrically conductive elongated nanostructures in the aqueous dispersion ranges from about 0.5 mg/ml to about 5 mg/ml. In some exemplary embodiments, the concentration of the electrically conductive elongated nanostructures in the aqueous dispersion is about 1 mg/ml. In some exemplary embodiments, the concentration of the electrically conductive elongated nanostructures in the aqueous dispersion is about 10 mg/ml. In some exemplary embodiments, the elongated nanostructures include CNTs. In additional exemplary embodiments, the elongated nanostructures include AgNWs.

In certain embodiments, the aqueous dispersion further comprises a surfactant. Non-limiting examples of suitable surfactants include poly(oxyethylene)-substituted aromatic compounds such as Triton X-100, Triton X-114 or Triton N-100, sodium dodecyl sulfate (SDS) and dodecylbenzenesulfonic acid sodium salt (DDS). In some embodiments, the surfactant is non-ionic. In some exemplary embodiments, the surfactant is Triton X-100. The concentration of the surfactant can range from about 0.5 mg/ml to about 50 mg/ml of the aqueous dispersion.

The dispersion of the electrically conductive elongated nanostructures can be prepared by adding the desired mass of the nanostructures and, optionally, of the surfactant, to water and centrifuging the mixture for 5 minutes to 2 hours. Centrifugation speed can range from 1,000 rpm to 10,000 rpm. In some exemplary embodiments, the mixture is centrifuged at 6,000 rpm for about 30 minutes.

According to some embodiments, the liquid dispersion comprising semi-conducting CNTs is an aqueous dispersion. The concentration of the semi-conducting CNTs in the aqueous dispersion can range from about 0.0001 mg/ml to about 0.01 mg/ml. In some embodiments, the concentration of the semi-conducting CNTs in the aqueous dispersion ranges from about 0.0005 mg/ml to about 0.05 mg/ml. In some exemplary embodiments, the concentration of the semi-conducting CNTs in the aqueous dispersion is about 0.001 mg/ml. The aqueous dispersion comprising semi-conducting CNTs can further include a surfactant. In some embodiments, said surfactant is a fluorosurfactant, such as, but not limited to, FluorN 561 or FluorN 562. In some embodiments, the aqueous dispersion comprising semi-conducting CNTs further comprises surface-tension modifiers, such as, but not limited to, propylene glycol. The aqueous dispersion can be prepared by any appropriate mixing process, including, inter alia, ultrasonication.

In some embodiments, the step of applying a liquid dispersion comprising semi-conducting CNTs onto the at least one source electrode and the at least one drain electrode further comprises heating the dispersion at a temperature of from about 70° C. to about 110° C. for about 10 minutes to about 1 hour.

The rigid substrate can be made of a material selected from glass, silicon wafer, sapphire, quartz, or metal oxide. In some embodiments, the rigid substrate is surface-treated. Without wishing to being bound by theory or mechanism of action, it is contemplated that surface treatment of the rigid substrate reduces adhesion of the disulfide-containing PUU polymer to the rigid substrate, therefore allowing easy detachment of the self-healing dielectric layer and the self-healing substrate from said rigid substrate. Non-limiting examples of suitable surface treatment processes include plasma treatment, strong oxidant liquid treatment, addition of surface groups or any combination thereof. In certain embodiments, the rigid substrate is treated by oxygen plasma. In further embodiments, the rigid substrate is further treated by hexyltrichlorosilane. In certain embodiments, the rigid substrate is immersed into a solution of hexyltrichlorosilane for up to about 2 minutes.

As mentioned hereinabove, the disulfide-containing PUU polymer or prepolymer can include 4-aminophenyl disulfide (APDS) monomers and poly(propylene glycol) tolylene 2,4-diisocyanate terminated (PPG-TDI) monomers. In some embodiments, the mass ratio between the APDS monomer and the PPG-TDI monomer ranges from about 11:100 to about 13:100. In some exemplary embodiments, said mass ratio is 12:100.

The term "prepolymer", as used herein refers in some embodiments to a combination of monomers, which are capable of polymerization by reactive groups to a fully cured high molecular weight polymeric form.

The disulfide-containing PUU polymer or prepolymer can be dissolved in any suitable organic solvent, such as, but not limited to tetrahydrofuran (THF). The concentration of the disulfide-containing PUU polymer or prepolymer in the solution can range from about 50 mg/ml to about 1 g/ml. In further embodiments, the concentration of the disulfide-containing PUU polymer or prepolymer in the solution ranges from about 100 mg/ml to about 500 mg/ml. In some exemplary embodiments, the concentration of the disulfide-containing PUU polymer in the solution is about 200 mg/ml.

The steps of applying the disulfide-containing PUU polymer or prepolymer (steps [402] and [405]) can be performed by any suitable process as known in the art. Non-limiting examples of suitable processes include drop-casting, spin-coating, dip-coating, drop-coating, printing, screen printing, and combinations thereof. In some exemplary embodiments, the steps of applying the solution comprising the disulfide-containing PUU polymer or prepolymer are performed by drop-casting. In further embodiments, the steps of applying the solution comprising the disulfide-containing PUU polymer further include spin-coating. Spin coating can be performed to obtain the desired thickness of the self-healing substrate and the self-healing dielectric layer, as disclosed hereinabove. In particular, the thickness of the disulfide PUU polymer layer can be easily controlled by controlling the speed and/or duration of the spin-coating process and/or the concentration of the polymer solution. For example, spin-coating can be performed at a rate of from about 500 rpm to about 3,000 rpm for about 10 seconds to about 10 minutes. In some embodiments, step [402] comprises spin-coating of the solution comprising the disulfide-containing PUU polymer at a rate of from about 500 rpm to about 2,000 rpm. In further embodiments, said solution is spin-coated for about 30 seconds to about 2 minutes. In some embodiments, step [405] comprises spin-coating of the solution comprising the disulfide-containing PUU polymer or prepolymer at a rate of from about 1,000 rpm to about 3,000 rpm. In further embodiments, said solution is spin-coated for about 60 seconds to about 3 minutes.

In some embodiments, the steps of applying the solution comprising the disulfide-containing PUU polymer or prepolymer, in particular when the solutions comprise a prepolymer, are followed by heating. The heating can be performed for about 2 hours to about 24 hours at a temperature ranging from about 50° C. to about 120° C.

According to some embodiments, the flexible substrate in step [403] comprises a polymer selected from the group consisting of PS-b-PI-b-PS, PDMS and polybutadiene rubber. In certain embodiments, the flexible substrate comprises PS-b-PI-b-PS. Said flexible substrate can be prepared as known in the art, for example by dissolving PS-b-PI-b-PS in toluene and casting it in a mold having a desired shape.

In some embodiments, the flexible substrate comprises an adhesive layer. In further embodiments, said adhesive layer is a sacrificial layer comprising a water-soluble polymer, as detailed hereinabove. In certain embodiments, the flexible substrate further comprises a backing layer.

The method can further comprise a step of separating the flexible substrate from the self-healing substrate. When the flexible substrate comprises a sacrificial adhesive layer, the step of separating the flexible substrate from the self-healing substrate can be carried out by rinsing the FET device or by immersing it in water.

The steps of transferring the gate electrode and the self-healing substrate to a flexible substrate (step [403] and a step of transferring the at least one source electrode, the at least one drain electrode, and the dielectric layer to the gate electrode (step [406]) can be performed by applying pressure and/or heating said FET components supported on the rigid substrate. In some embodiments, the heating temperature ranges between about 30° C. and about 80° C. In some embodiments, the applied pressure ranges from about 10 to about 100 kPa.

In some embodiments, the fabrication method further comprises rinsing the obtained FET device in DI water for 10 minutes to about 5 hours. In some exemplary embodiments, the FET device is rinsed for about 1 hour. The FET device can be further dried in a vacuum oven at a temperature of about 50° C. to about 120° C.

In some embodiments, the fabrication method further comprises application of additional layers to the FET device, including an elastic layer, protective layer, backing layer, and/or adhesive layer.

FET Device Features and Uses

The FET device according to the principles of the present invention is configured to self-heal following mechanical damage of each of its components, including the substrate, the electrodes, the dielectric layer and the channel.

According to some embodiments, the self-healing FET device is configured to self-heal following mechanical damage of at least one of the substrate, the dielectric layer, or the electrodes within less than about 24 hours at room temperature. Each possibility represents a separate embodiment of the invention.

In some embodiments, the self-healing substrate is configured to physically recombine following mechanical damage within less than about 24 hours at room temperature. In further embodiments, the self-healing substrate is configured to physically recombine following mechanical damage within less than about 12 hours at room temperature.

In some embodiments, the self-healing dielectric layer is configured to physically recombine following mechanical damage within less than about 24 hours at room temperature. In further embodiments, the self-healing dielectric layer is configured to physically recombine following mechanical damage within less than about 12 hours at room temperature.

In additional embodiments, the at least one source electrode and/or the at least one drain electrode is configured to regain at least about 50% of the conductivity thereof following mechanical damage within less than about 30 minutes. In further embodiments, the at least one source electrode and/or the at least one drain electrode is configured to regain at least about 50% of the conductivity thereof within less than about 20 minutes or less than about 10 minutes. In some embodiments, the at least one source electrode and/or the at least one drain electrode is configured to regain at least about 60% of the conductivity thereof following mechanical damage within less than about 30 minutes, at least about 70%, or at least about 90% of the conductivity thereof. Each possibility represents a separate embodiment of the invention. In certain embodiments, the mechanical damage comprises a full cut of the at least one source electrode and/or the at least one drain electrode.

In further embodiments, the gate electrode is configured to regain at least about 50% of the conductivity thereof following mechanical damage within less than about 30 minutes. In further embodiments, the at least one gate electrode is configured to regain at least about 50% of the conductivity thereof within less than about 20 minutes or less than about 10 minutes. In some embodiments, the gate electrode is configured to regain at least about 60% of the conductivity thereof following mechanical damage within less than about 30 minutes, at least about 70%, or at least about 90% of the conductivity thereof. Each possibility represents a separate embodiment of the invention. In certain embodiments, the mechanical damage comprises a full cut of the gate electrode.

According to some embodiments, the FET device is configured to self-heal following mechanical damage of at least one of the substrate, the dielectric layer, or the electrodes following more than 2 cycles of mechanical damage. According to further embodiments, the FET device is configured to self-heal following mechanical damage of at least one of the substrate, the dielectric layer, or the electrodes following more than 3 cycles of mechanical damage.

According to further embodiments, the source electrode and/or drain electrode is configured to regain at least about 50% of the conductivity thereof following at least about 3 cycles of mechanical damage and healing thereof. In yet further embodiments, the gate electrode regains at least about 50% conductivity following at least about 3 cycles of mechanical damage and healing. In certain embodiments, the cycles of mechanical damage and healing include mechanical damage applied to the same portion of the electrodes. In certain embodiments, the mechanical damage comprises a partial cut of the electrodes. In other embodiments, the mechanical damage comprises a full cut of the electrodes.

The FET device of the present invention may be used in applications which require long-term stability and tolerance towards mechanical damage and which do not allow convenient or frequent replacement of the sensors. Non-limiting examples of such applications include epidermal sensing devices and artificial and/or electronic skin. Artificial and/or electronic skin may be integrated in medical prosthesis and robotics industries, providing ultrasensitive human-machine interaction and healthcare monitoring. The FET device according to the various embodiments of the present invention can be further used as wearable sensors, for example, in garment-based systems. The device can also be used for hard-to-reach areas, such as space, where durability, long lifetime and autonomic self-healing ability are highly desirable.

Accordingly, in some embodiments, the FET device according to the various embodiments of the invention is integrated on electronic or artificial skin surface. In additional embodiments, the FET device is integrated in an epidermal sensing system.

As used herein and in the appended claims the singular forms "a", "an," and "the" include plural references unless the content clearly dictates otherwise. Thus, for example, reference to "a channel" includes a plurality of such channels as known to those skilled in the art, and so forth. It should be noted that the term "and" or the term "or" is generally employed in its sense including "and/or" unless the content clearly dictates otherwise.

As used herein, the term "about", when referring to a measurable value such as an amount, a temporal duration, and the like, is meant to encompass variations of +/−10%, more preferably +/−5%, even more preferably +/−1%, and still more preferably +/−0.1% from the specified value, as such variations are appropriate to perform the disclosed methods.

The following examples are presented in order to more fully illustrate some embodiments of the invention. They should, in no way be construed, however, as limiting the broad scope of the invention. One skilled in the art can readily devise many variations and modifications of the principles disclosed herein without departing from the scope of the invention.

EXAMPLES

Characterization Methods
Electrical and Mechanical Characterization
The dielectric constant and capacitance of the elastomeric dielectric were measured using an LCR meter. Two-point resistance measurements were done on the CNT electrodes with a Keithley (model 2701 DMM). Transistor characteristics were collected using a Keithley (2636A SYSTEM Source-Meter) controlled by a custom Labview program at ambient atmosphere. Devices were conditioned at ambience before measurements to minimize the confounding effects of absorption of water in the dielectric. Stretching for electrical performance involved a manual apparatus. Mechanical stress-strain experiments were performed using Instron to measure tear strength and tensile properties of the polymers. The stretching rate was 100 mm min$^{-1}$.

Self-Healing Tests

Self-healing processes were monitored using an optical microscope (BX51M, Olympus) with integrated camera (LC20, Olympus). SEM was also used to detect the self-healing of the semi-conductive channel. Electrical self-healing characterization of electrodes was done by 2-point resistance using a Keithley data logger device (model 2701 DMM), controlled by a custom Labview program; this allowed us to acquire sequential resistance readings from the CNT conductive films. Cutting was done with a ~20 μm blade or >1 μm razor-sharp blade. Self-healing characterization of the transistor was done by measuring the device performance before damage, during damaging, and at different times afterwards. Four different damaging actions were taken: the blade cutting through the source/drain, and the gate; also cutting the semi-conducting channel, cutting the whole device by scissors and then reconnecting both parts.

Sensing Experiments

For temperature sensing, the transistor was monitored while attached to a surface at fixed temperatures ranging from 0 to 60° C. The transistor was covered with PS-b-PI-b-PS and PDMS to prevent any effects from the external environment (e.g. humidity).

For skin humidity, lotion was applied to the skin to increase its hydration level, and skin humidity monitored by 2 sensors, the self-healing sensor and a commercial digital moisture monitor for skin (model SK-IV). The transistor was covered with PDMS in this experiment to prevent direct attachment to the skin.

Figure 5:
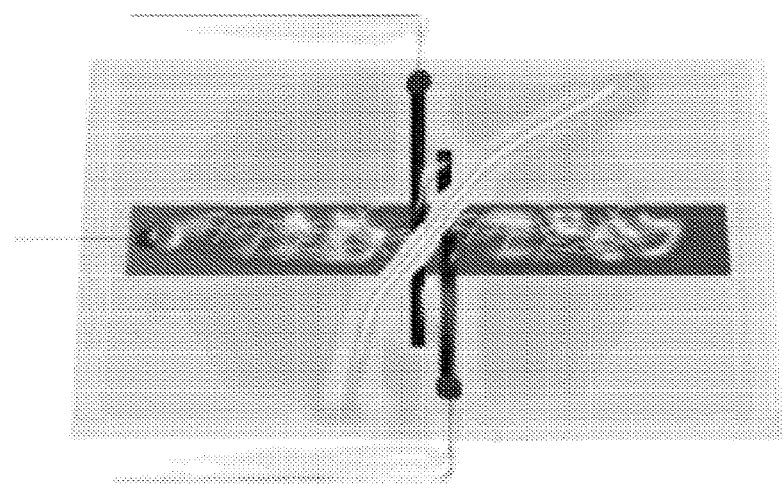
FIG. 5: Photograph of the structurally damaged FET device comprising electrically conductive CNTs tested in the self-healing experiments.

For the temperature and humidity sensing experiments, the inflicted mechanical damage affected all components of the FET, as shown in FIG. 5.

Example 1—Evaluation of the Disulfide-Containing PUU Polymer

Figure 6A:
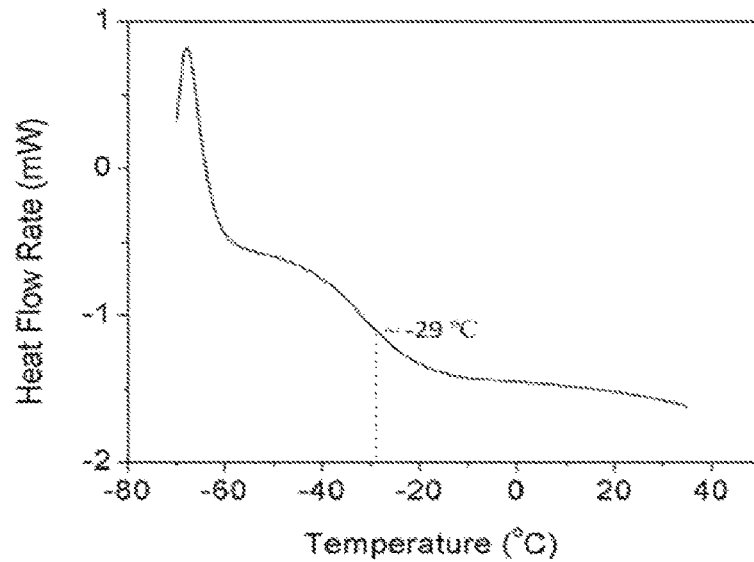
FIG. 6A: Differential Scanning calorimetry (DSC) curve recorded for the PUU polymer composed of 4-aminophenyl disulfide (APDS) monomer and a poly(propylene glycol) tolylene 2,4-diisocyanate terminated (PPG-TDI) monomer with a mass ratio between the APDS monomer and the PPG-TDI monomer of 12:100 (the polymer termed herein "PUU12") at a scan rate of 10° C. min$^1$.

An intrinsic self-healing disulfide-containing poly(urea-urethane) polymer was used to prepare the self-healing substrate and the self-healing dielectric layer of the FET device. The polymer is composed of the APDS and PPG-TDI monomers and has dynamic hydrogen and disulfide bonds. The reversible nature of these bonds combined with the low glass transition temperature ($T_g$) of the polymer make it a very efficient self-healing material (FIG. 6A).

Influence of the mass ratio between the APDS and PPG-TDI monomers on the mechanical and self-healing properties was investigated. Three different polymers with APDS to PPG-TDI mass ratios of 11:100, 12:100 and 13:100 were synthesized, which were termed PUU11, PUU12 and PUU13, respectively. The high ratio led to a very soft polymer that could not hold its shape under ambient conditions. At the mass ratio close to 10.5:100 (which is 1:1 molar ratio) a mechanically strong polymer was obtained, which undergoes small deformation under mechanical stress. On the other hand, considering the self-healing ability, higher APDS content led to a higher self-healing ability as the obtained polymer was softer. Table 1 summarized the mechanical and self-healing properties of the PUU11, PUU12, and PUU13 polymers.

Figure 6B:
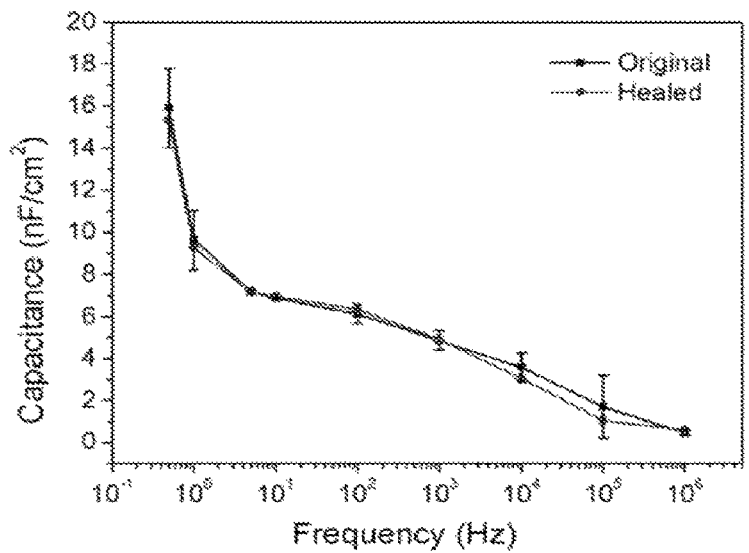
FIG. 6B: Capacitance of PUU12 over frequencies ranging from 0.1 to 10$^6$, before (■) and after (●) mechanical damage.

For the fabrication of the FET device (as described in Example 2 below), PUU12 was chosen, as it showed the best combination between mechanical properties and self-healing ability. Similar to many low $T_g$ polymers/elastomers, PUU12 has very high electrical capacitance (FIG. 6B). Without wishing to being bound by theory or mechanism of action, said high capacitance could be attributed to the high-mobility of chains, the high polarity, and the existence of ionic impurities inside the polymeric structure, such as residues that had become incorporated during synthesis of the elastomer.

TABLE 1

Mechanical and self-healing properties of disulfide-containing PUU polymers

| Property | Strain at break point (%) | Stress at break point (MPa) | Healing time of 2 μm wide cut (hr) | Healing efficiency* (%) |
|---|---|---|---|---|
| PUU11 | 650 ± 59 | 0.61 ± 0.012 | No healing | 56 ± 7 |
| PUU12 | 940 ± 45 | 0.33 ± 0.023 | ~24 | 87 ± 5 |
| PUU13 | 300 ± 10 | ~0 | ~1 | 100 ± 0.2 |

*Calculated according to strain at break-point.

Example 2–Fabrication of the FET Device Comprising CNTs-Based Electrodes

The FET devices were prepared by transfer printing. Said method is particularly compatible with self-healing polymers because of their natural healing ability, which makes for easy transfer and great attachment of one layer on to another. For semi-conductor preparation, carbon nanotubes (CNTs) were plastered to the surface of the PUU12 dielectric to obtain both semi-conductivity and self-healing abilities; the same strategy being used to prepare the electrodes.

The detailed fabrication method is as follows: All solvents were received from commercial sources and used as received. Poly(propylene glycol), tolylene 2,4-diisocyanate terminated (PPG-TDI), glycerol, 4-aminophneyl disulfide (APDS), Triton X-100, hexyltrichlorosilane, polyvinyl alcohol (PVA), and polystyrene-block-polyisoprene-block-polystyrene (PS-b-PI-b-PS, 17% styrene) were obtained from Sigma-Aldrich. CNTs for electrodes (>75%) were purchased from TUBALL. Semi-conducting CNT aqueous solution (+99%, 0.01 mg/ml) was obtained from Nanointegris. FluorN 561 fluorosurfactant was obtained from Cytonix.

PS-b-PI-b-PS, which is stretchable and mechanically durable, and most importantly, exhibits some kind of a self-healing ability as shown in a recent study,[32] was used as a substrate to allow easy-handling of the device. This substrate was prepared by dissolving 80 mg PS-b-PI-b-PS in 1 ml toluene, and cast in a Teflon mold. When dried in the hood, the sample was left under vacuum to obtain a ~500 μm thick elastic substrate.

Solutions for CNT electrodes were prepared by dispersing 1 mg CNTs in 1 ml water, using 5 mg/ml Triton X-100 as a surfactant. The solution was centrifuged at 6000 rpm for 30 min before use. For electrode preparation, CNT dispersion was sprayed through a shadow-mask on a slightly modified silicon wafer, prepared by treatment with oxygen plasma and then immersion in a solution of hexyltrichlorosilane in toluene for 1 min (long immersion time leads to very hydrophobic surface, which is not convenient for spraying the aqueous dispersion of CNT). PUU is very sticky to the non-modified wafer preventing subsequent peeling off.

PUU12 precursor solution 200 mg/ml in THF consisting of PPG-TDI and APDS with a mass ratio of 100:12 was drop-casted on the gate electrode, left to dry for 1 min, followed by spinning at 1000 rpm for 1 min to obtain about 20 μm PUU substrate. The obtained composite was transferred to PS-b-PI-b-PS elastic film by applying gentle pressure and heating. The same polymeric solution was spun-coated on the source drain electrodes at 2000 rpm to about 2 μm thick dielectric, which was transferred later on to the gate electrode by applying gentle pressure and heat. Semiconductive CNT ink was prepared by mixing 99% semiconducting-SWCNT solution, DI-water, propylene glycol and FluorN 561 at the ratio of 1:6:1.25:0.75 (by volume), followed by ultrasonication. Subsequently, 30 μL semiconductive CNT ink was drop-casted on the CNT source/drain composite electrodes and heated to 90° C. for 30 min. The device was rinsed in DI water for 1 h to remove the surfactants, and then left in a vacuum oven at 90° C. for several hours. Note, the whole device can be potentially printed since all materials are solution-processable, enabling high-throughput production.

Example 3: Fabrication of the Ultrathin FET Device

Figure 7A:
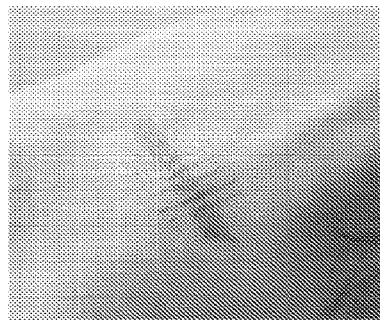
Figure 7B:
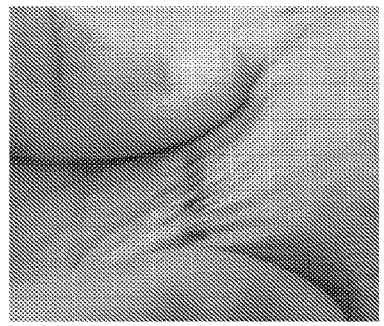
Figure 7C:
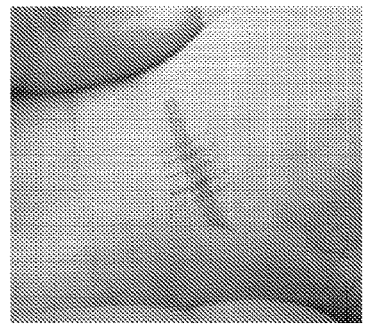

The same method described in Experiment 2 was used, except that the PUU12 precursor solution 200 mg/ml in THF consisting of PPG-TDI and APDS with a mass ratio of 100:12 was drop-casted on the gate electrode and followed by spinning at 4000 rpm for 1 min to obtain about ~1 μm PUU substrate. Additionally, instead of transferring the device to PS-PI-PS, it was transferred to PVA-coated paper. Furthermore, the device was coated with another layer of 1 μm PS-PI-PS and 1 μm PDMS (on top of the channel and source and drain (SD) electrodes to prevent direct contact with the skin. The obtained FET device was applied to skin by gentle pressure, washed with water to dissolve the PVA layer and release the device on to the skin. The obtained FET, which is applied to skin, is shown in FIGS. 7A-7C.

Example 4: Electrical Characterization of the FET Device

Figure 7D:
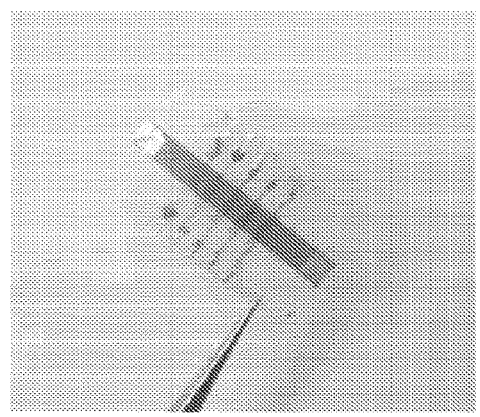
FIGS. 7D-7E: Photographs of the FET device including a PET flexible substrate (FIG. 7D) or a PS-b-PI-b-PS elastic substrate (FIG. 7E).
Figure 7E:
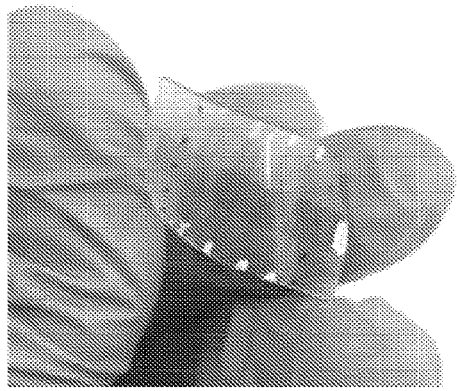
Figure 8A:
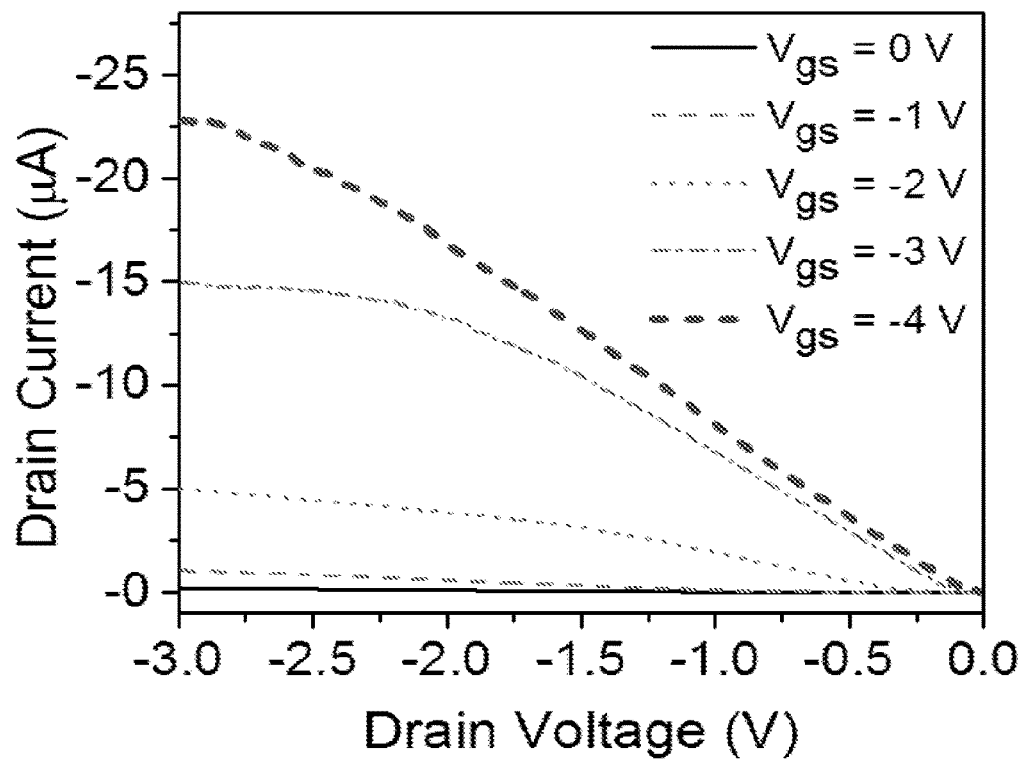
FIG. 8A: Output characteristics of the FET device, with gate voltages from 0 to −4 V in −1 V steps.
Figure 8B:
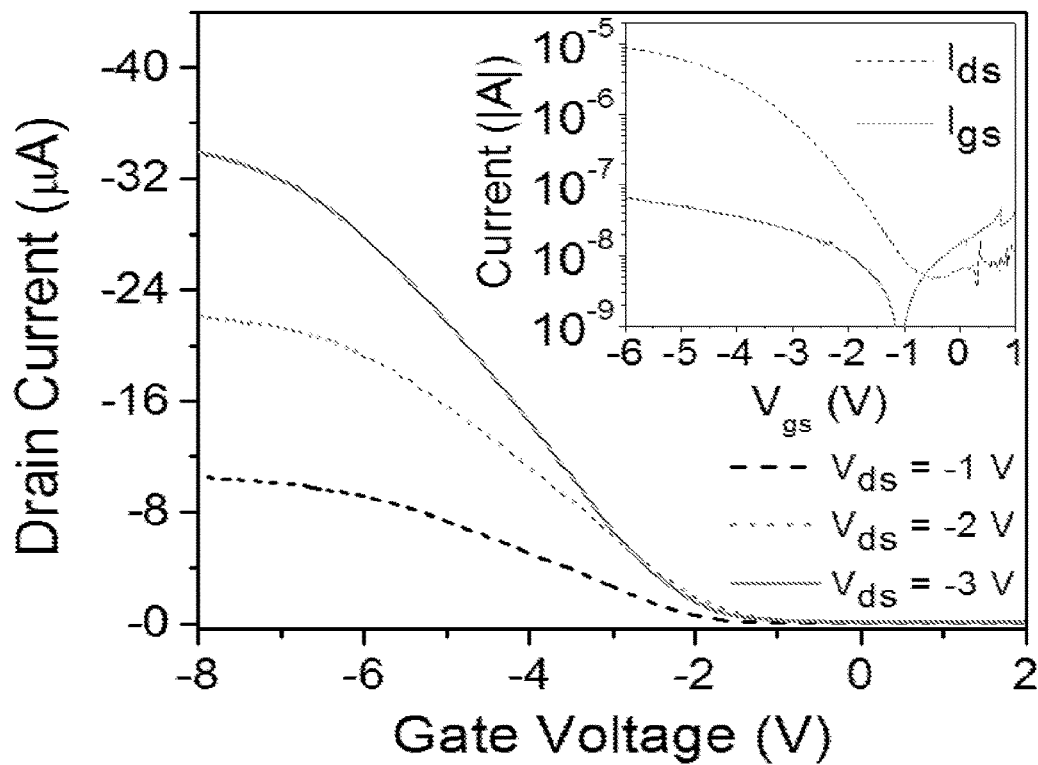
FIG. 8B: Transfer characteristics of the FET device with drain voltage from −1 to −3, wherein inset shows transfer curve at $V_d$=−1 V (dotted line), and gate-leakage current in the same range (solid line).

Top-contact bottom-gate transistors were fabricated by transfer printing, as described in Example 2 and supported on a PET substrate and a PS-PI-PS substrate (FIGS. 7D-7E). Representative self-healing transistors with a 200 μm channel-length and 5000 μm channel-width supported on the PS-PI-PS substrate were used to measure performance. A typical output curve of the transistor, showing a good linear and saturated behavior, and a representative transfer curve, are depicted in FIGS. 8A and 8B, respectively. High on-current ($I_{on}$) of ~30 μA, $\mu_h$ of ~10 cm$^2$ V$^{-1}$ s$^{-1}$, and an average on/off ratio of ~10$^3$ were obtained, consistent with previously reported CNT transistor using the same semiconducting material (Liang, J. et al. Intrinsically stretchable and transparent thin-firm transistors based on printable silver nanowires, carbon nanotubes and an elastomeric dielectric. Nature Commun. 6, (2015)). The high capacitance of PUU12 allowed the device to turn on at low biases (up to 6 V), which is highly desirable for wearable electronics.

Example 5: Self-healing Ability of the FET Device

Figure 9A:
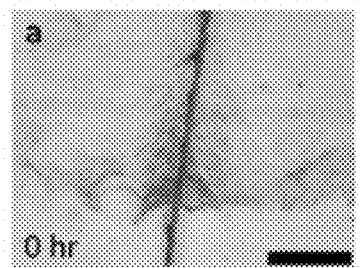
FIGS. 9A-9C: Structural monitoring of the self-healing process at different times (FIG. 9A: 0 hours following the cut, FIG. 9B: 12 hours following the cut, and FIG. 9C: 24 hours following the cut). Scale bar: 200 μm.
Figure 9B:
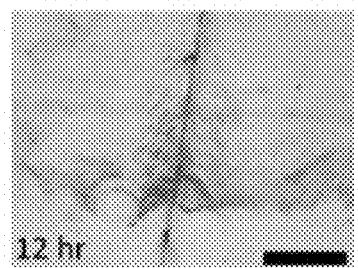
Figure 9C:
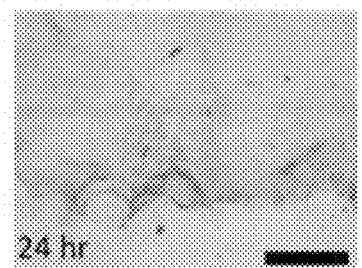
Figure 10A:
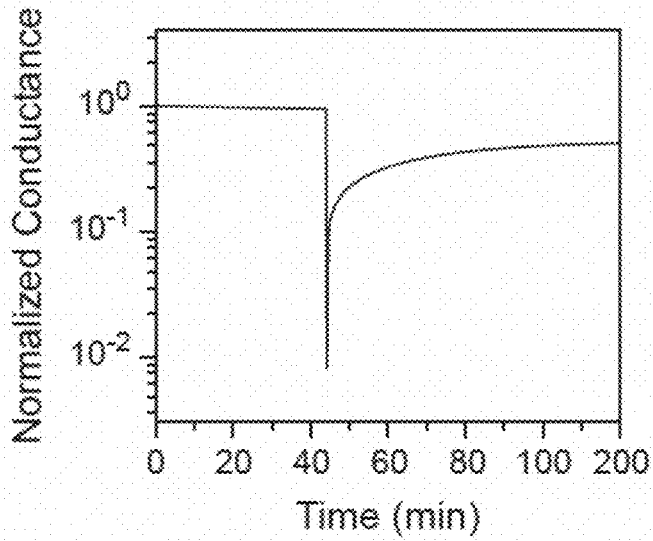
FIG. 10A: Dynamicity of the self-healing process of the electrodes comprising electrically conductive CNTs coated with the disulfide-containing PUU layer, as represented by conductance normalized to the initial conductance (i.e., before damaging the film).
Figure 10B:
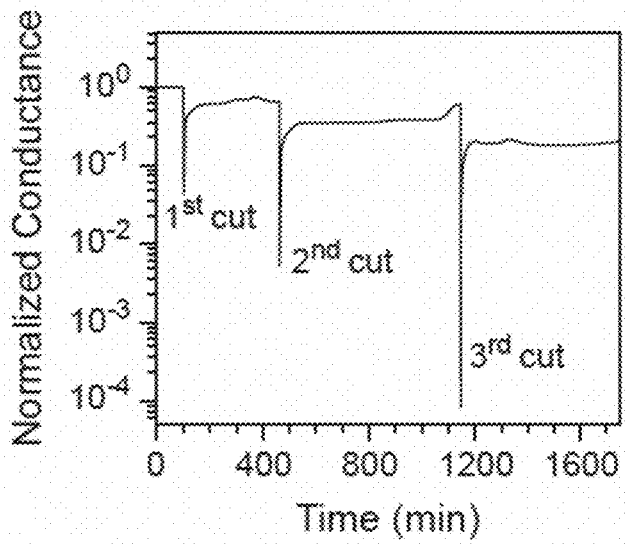
FIG. 10B: Recovery of the electrodes comprising electrically conductive CNTs spun-coated on the disulfide-containing PUU layer from several damage cycles, as represented by conductance normalized to the initial conductance (i.e., before damaging the film).

To prove autonomic self-healing ability (i.e., self-healing without aid from any external trigger, e.g., temperature, organic solvent vapor or light) of different components of the FET, the device was cut using a sharp blade and followed by monitoring its performance and structural recovery with time. At the beginning, the self-healing ability of the conductive CNT network embedded in PUU12 was examined. FIGS. 9A-9C show optical images of the healing process of structural damage after a blade-cut made perpendicular to the conduction pathway. This conductive film can recover from a drastic cut (about 5 μm in width and 2 μm in depth) quickly and maintains good conductivity. The self-healing process has a typical behavior with time; a very sharp increase in the conductivity can be seen at the beginning of the recovery, which decreases with time to reach a plateau (FIG. 10A). Without wishing to being bound by theory or mechanism of action, it is assumed that the fast initial self-healing is due to shape recovery of the elastic polymer near the damaged area, wherein said fast process is followed by slow recovery that might be dominated mainly by the surface rearrangement and diffusion of the polymer chains. Recovery of several damage cycles in the CNTs-based electrodes was also assessed (FIG. 10B).

Figure 11A:
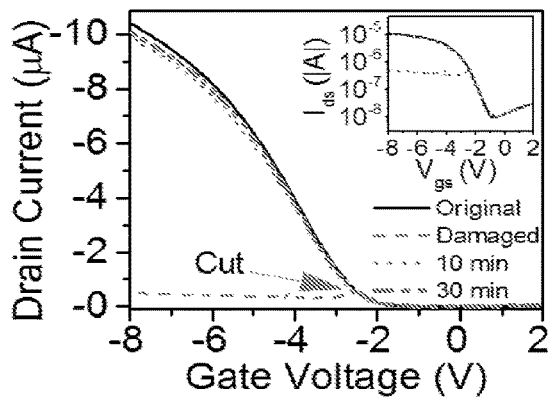
FIGS. 11A-11B: Transfer curves showing the time-dependent healing of the gate electrode (FIG. 11A), and the source drain (SD) electrodes (FIG. 11B), wherein insets show logarithmic scale.
Figure 11B:
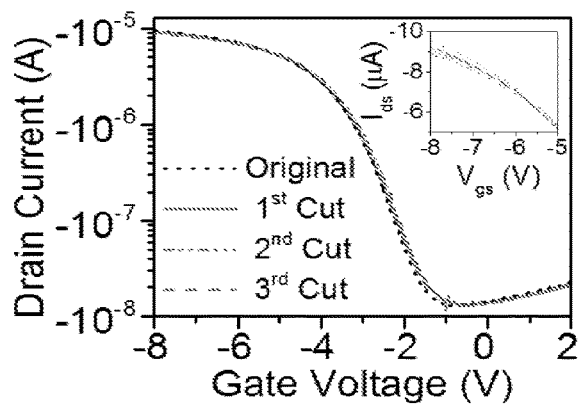
Figure 11C:
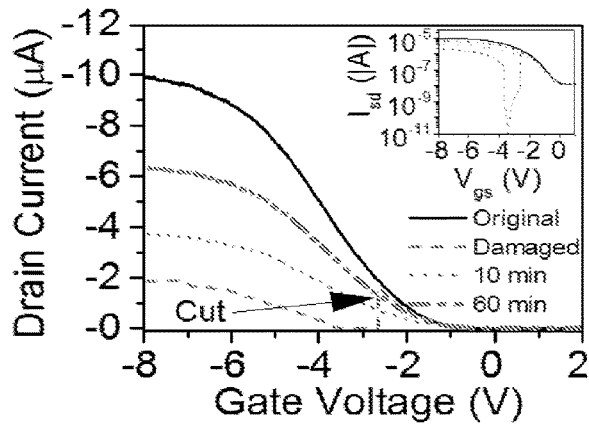
FIGS. 11C-11D: Transfer curves showing the ability to heal several cuts in the gate (FIG. 11C), wherein inset shows a zoom-in on the high current regime; and in the SD electrodes (FIG. 11D), wherein inset shows logarithmic scale.
Figure 11D:
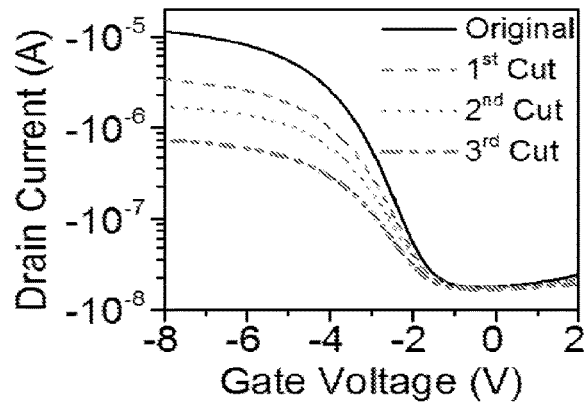

The next experimental step included evaluation of the effect of mechanical damage on each one of the gate electrode, source electrode and drain electrode and their related performance. In the case of gate damage, gate modulation was stopped after the cut, preventing further increase in the drain current (FIG. 11A). The behavior of the FET was almost totally recovered after 1 h. The gate electrode could heal several cuts with negligible change in performance (FIG. 11B). On the other hand, the drain current was dramatically decreased (<10$^{-10}$ A) immediately after source/drain (SD) electrode cut, and then started to increase back towards the initial value. The self-healing process took 1 h and the last value was lower than the original value (FIG. 11C). Several cut cycles in the SD electrode could also be recovered. The initial cut caused the largest decrease in the drain current compared to subsequent damage (FIG. 11D).

Figure 12:
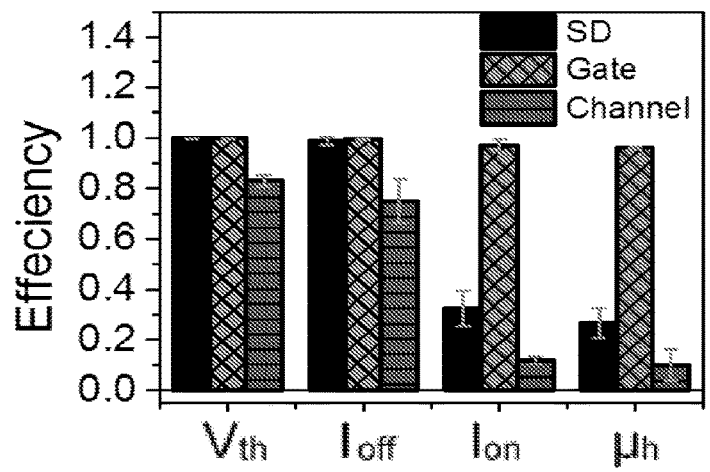
FIG. 12: Self-healing efficiencies following damage inflicted on the different components of the FET device, as represented by the following parameters: voltage threshold ($V_{th}$), on-current ($I_{on}$), off-current ($I_{off}$), and hole mobility ($\mu_h$), wherein efficiency was evaluated according to: $\varepsilon=(f_{healed}-f_{damaged})/(f_{original}-f_{damaged})$, where f is the characteristic parameter (left bar: damage inflicted on the SD electrodes, middle bar: damage inflicted on the gate electrode, and right bar: damage inflicted on the channel).

The efficiency of self-healing was evaluated using 4 characteristic parameters: $I_{on}$, $\mu_h$, off-current ($I_{off}$), and threshold voltage ($V_{th}$) (FIG. 12). Starting from gate damage, the healing efficiency of all parameters was very high (>98%), but damage in the SD showed lower self-healing ability. The $\mu_h$ and the $I_{on}$ have decreased by a factor of 3, whereas the $I_{off}$ and $V_{th}$ had efficiently recovered to near their initial values. A cut in the channel was destructive, resulting in low self-healing efficiencies (about 10% with respect to $I_{on}$ and $\mu_h$. The efficiencies of $I_{off}$ and $V_{th}$ were also affected but remained relatively high (>75%). It should be noted, however, that such large-scale highly-deforming damages are not anticipated in real life applications where the main damages are microcracks caused by continuous mechanical loads/stresses. However, an event of a severe blade cut over the entire device has a very low probability.

To produce more severe damage, the whole FET device was completely cut with scissors and its performance was monitored after the reconnection of the two parts. Unexpectedly, a transistor-like behavior was recovered after about 2 h (FIG. 13). This also proved to be the case using a light emitting diode (LED) driven by the self-healing FET. FIG. 14A shows the LED intensity before the mechanical damage inflicted on the FET. FIG. 14B shows the LED directly after the reconnection of the FET. As can be seen from FIG. 14B, there was no noticeable light intensity immediately following the reconstruction. However, the LED intensity gradually increased with time (FIG. 14C).

Example 6: FET Device Performance Under Uniaxial Strain

Figure 15A:
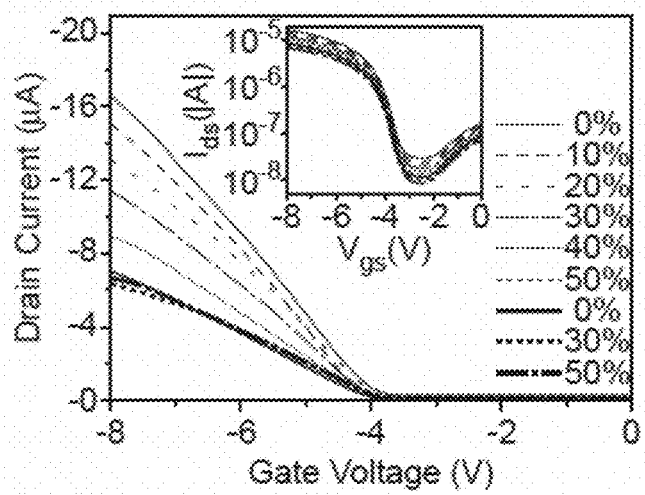
FIG. 15A: Typical transfer characteristics ($V_D$=−2.0 V) of the FET device under specific tensile strain applied along the channel length direction; first stretching cycle (grey lines), second stretching cycle (black lines).
Figure 15B:
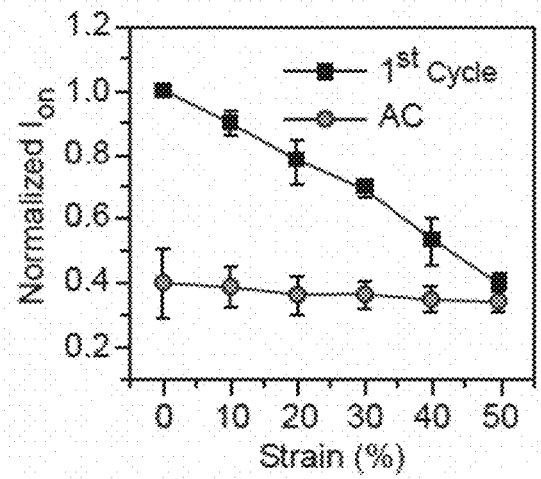
FIG. 15B-15E: Normalized electrical characteristics for stretched devices: $I_{on}$ (FIG. 15B), $I_{off}$ (FIG. 15C), mobility (FIG. 15D) and $V_{th}$ (FIG. 15E), wherein (■) represents said values obtained during the first cycle and (●) represents said values obtained after conditioning (AC).
Figure 15C:
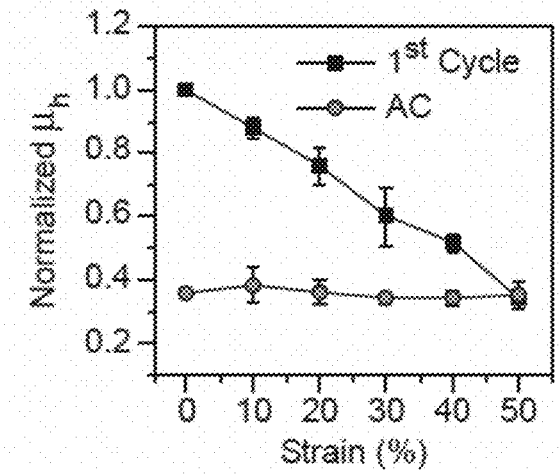
Figure 15D:
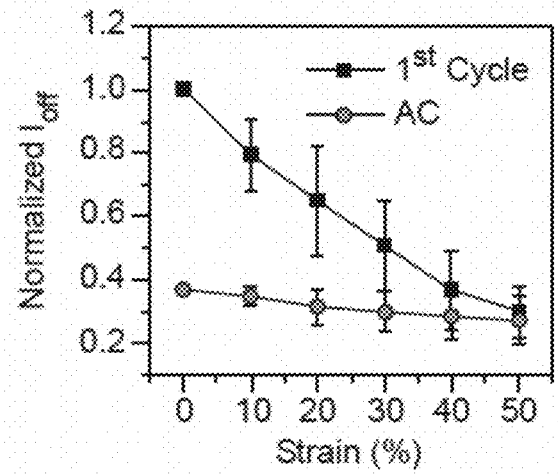
Figure 15E:
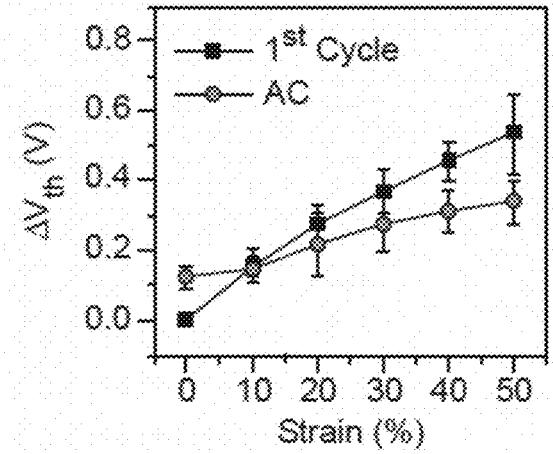

The FET device performance was tested under uniaxial strain either parallel or perpendicular to the charge transport direction. First, the devices were conditioned by initial cycles of strain up to 50%, rendering them with minimal sensitivity/drain current in subsequent strains. FIG. 15A displays the transfer curves of the transistor under different strain values from 0 to 50% before and after conditioning. The $I_{off}$, $I_{on}$ and $\mu_h$ decreased by up to about 60% with 50% strain (FIGS. 15B-15D). The $V_{th}$ had slightly shifted to more negative values as the strain increased (FIG. 15E). Without wishing to being bound by theory or mechanism of action, said shift in the $V_{th}$ values may be attributed to the small decrease in the capacitance as stretching leads to the arranged polymer chains, decreased polarity and lowered the amount of water inside.

After the first stretching cycle, the FET device became less sensitive to strain, with the changes in the $I_{off}$, $I_{on}$ and $\mu_h$ in response to strain becoming almost negligible. However, the $V_{th}$ maintained some sensitivity to strain, but it was lower compared to the original device (FIGS. 15B-15E). Having both strain-dependent and strain-independent parameters is desirable for obtaining multi-functional devices that can simultaneously detect strain values and other stimuli, e.g. temperature and humidity, without the need for complicated data-processing to separate the responses to each type of stimulus. Similar behavior was also observed with uniaxial strains perpendicular to the channel conduction pathway.

Figure 15F:
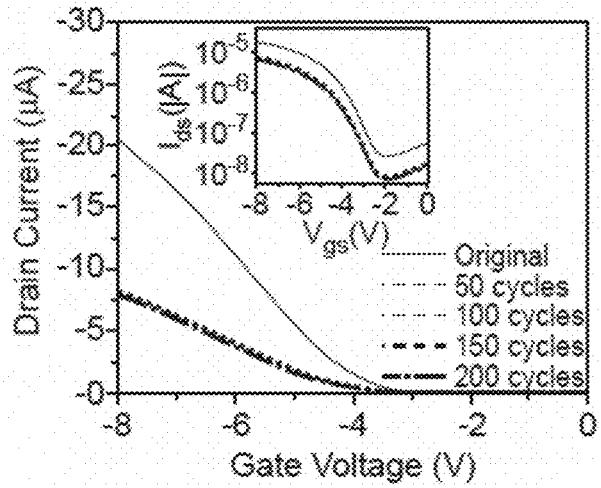
FIG. 15F: Typical transfer characteristics ($V_D=-2.0$ V) of a the device after cycles of 50% strain, wherein insets show log-scale characteristics.

A fatigue test was subsequently performed by applying continuous strain relaxation cycles up to 50% strain. FIG. 15F shows the transfer curves of the FET after different numbers of strain cycles, there being a negligible change with increasing number of cycles after the conditioning process.

Example 7: Temperature Sensing Properties of the FET Device

Figure 16A:
FIGS. 16A-16B: Photographs (two different views) of the epidermal ultrathin FET device applied to skin during temperature and humidity sensing measurements.
Figure 16B:
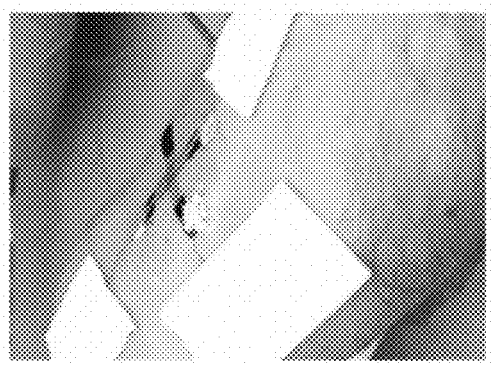
Figure 17:
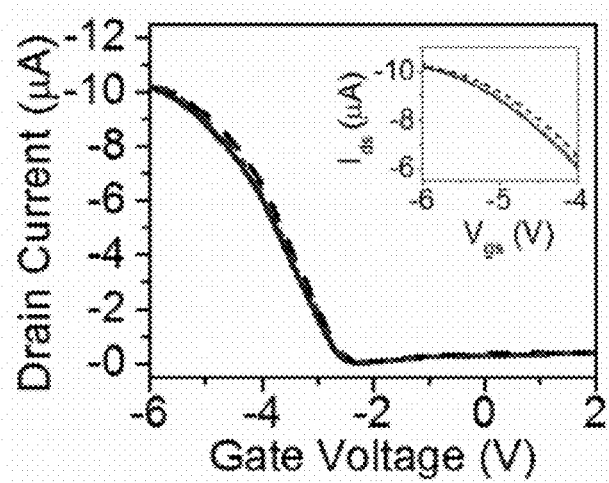
FIG. 17: Performance of the epidermal ultrathin FET device applied to skin at different arm positions that lead to different strains exerted on the epidermal device.

The self-healing FET is a multifunctional device as it can be used for many applications, such as sensing temperature and humidity. The ultrathin device can be applied to the skin as a tattoo, making it highly suitable for epidermal diagnostic applications. FIGS. 16A-16B provide two different views of the self-healing ultrathin FET device fabricated according to the procedure described in Example 3, which was applied on skin and connected with wires for measuring its performance under different hand positions. The performance of the FET as an epidermal sensor was, therefore, tested under different skin strains. The behavior was found to be stable; negligible changes being observed with different hand positions (FIG. 17).

Figure 18A:
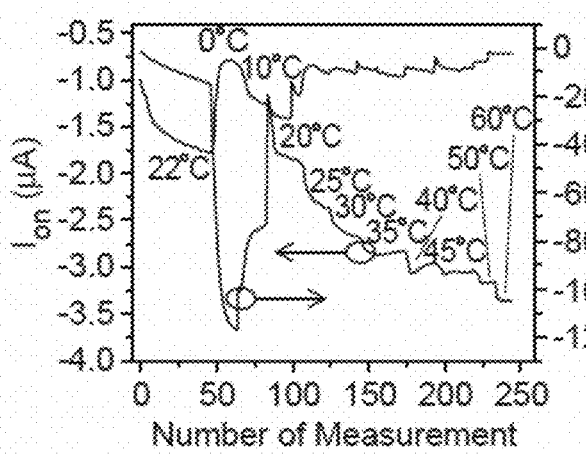
FIGS. 18A-18B: Sensitivity of the FET device to different temperatures, as represented by responses of $I_{on}$ (left axis) and $I_{off}$ (right axis) to the different temperatures (FIG. 18A), by normalized responses of $I_{on}$ (■) and $I_{off}$ (●) before self-healing (solid line) and after self-healing (dashed line) (FIG. 18B), and by $V_{th}$ (FIG. 18C).
Figure 18B:
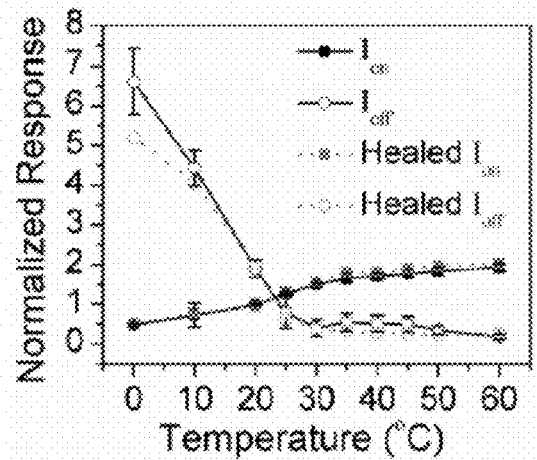
Figure 18C:
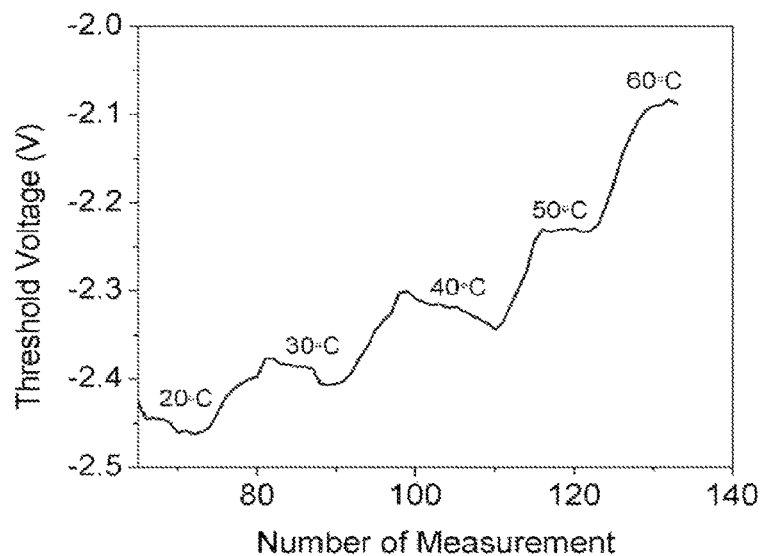

FIG. 18A shows the responses of the FET device fabricated according to the procedure described in Example 2, to temperatures from 0 to 60° C. The sensitivity of the sensor at lower temperatures was higher compared to high temperatures; the $I_{on}$ and $I_{off}$ had the biggest changes in lower temperatures (FIG. 18B). Without wishing to being bound by theory or mechanism of action, the difference in the temperature sensitivity might be explained by the lower temperatures limiting polymer mobility/softness, which decreases the gate modulation ability and also the $I_{on}$. The same effect can be seen on the $V_{th}$ where higher temperatures lead to lower $V_{th}$ values (FIG. 18C). Without further wishing to being bound by theory or mechanism of action, the increase in the $I_{off}$ with lower temperatures might be explained by the shrinkage of the film, leading to a denser carbon nanotube channel.

The temperature sensing ability was conserved after the healing of a structural damage. FIG. 18B further compares the normalized responses of pristine and recovered sensors. In this case, mechanical damage affected all the transistor components (FIG. 18D). It can clearly be seen that the difference between the pristine and recovered sensors is negligible.

Example 8: Humidity Sensing Properties of the FET Device

Figure 19A:
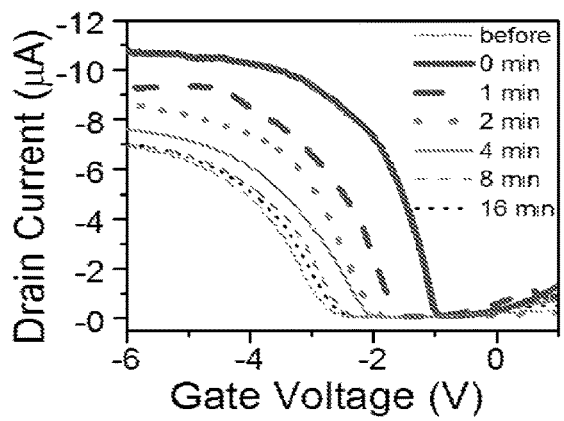
FIG. 19A: Transfer curves obtained from the epidermal ultrathin FET device applied to skin employed as a humidity sensor at different times after skin humidification.

A self-healing wearable skin hydration sensor has also been demonstrated. Without wishing to being bound by theory or mechanism of action, it is contemplated that PUU12 is highly affected by humidity as water molecules can be absorbed or desorbed, leading to changes in the elasticity of the materials and also the capacitance, a change that can give a good indication as to the hydration levels of the skin. In this experiment, lotion was applied to the skin to increase its hydration before skin humidity was monitored by two FET devices fabricated as described in Example 2, The self-healing epidermal sensor and a commercial skin humidity sensor. $I_{on}$ and the $V_{th}$ were used to monitor the effective of humidity. FIG. 19A shows the transfer curves obtained at different times after the application of lotion. The transistor shows lower $V_{th}$ directly after the humidification, which decreases and slowly with time approaches the original value. The same trend was seen with $I_{on}$.

Figure 19B:
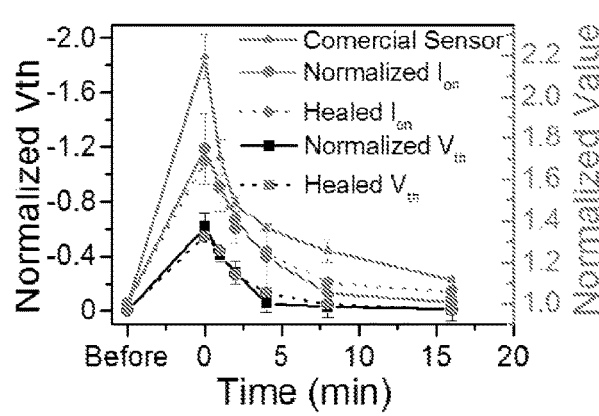
FIG. 19B: Normalized responses of $I_{on}$ and $V_{th}$ compared to the normalized response of a commercial sensor before and after self-healing of the epidermal ultrathin FET device.

FIG. 19B presents normalized responses of $I_{on}$ and $V_{th}$ compared to the normalized response of a commercial sensor before and after self-healing. Damage has a negligible effect on the sensitivity of sensors that completed the healing process. Both sensors followed the same trend, and the same behavior was seen after self-healing of the sensors.

Example 9: Statistical Distribution of FETs' Parameters

Figure 20A:
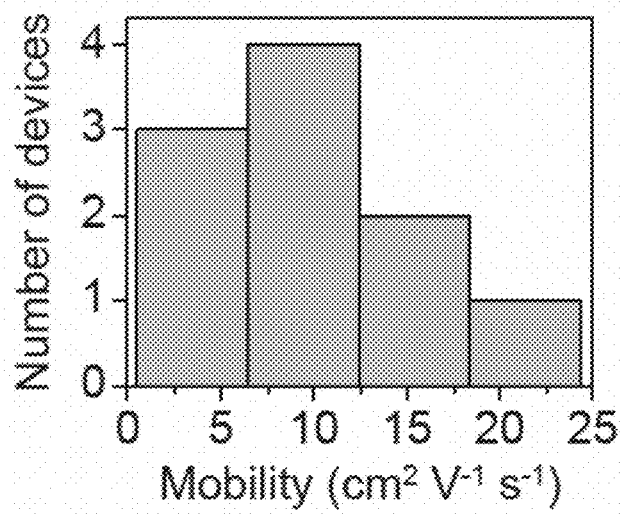
FIGS. 20A-20C: Histograms showing statistical distribution of the FET devices' mobility (FIG. 20A), $I_{on}$ normalized to device width (FIG. 20B) and $I_{on}/I_{off}$ (FIG. 20C).
Figure 20B:
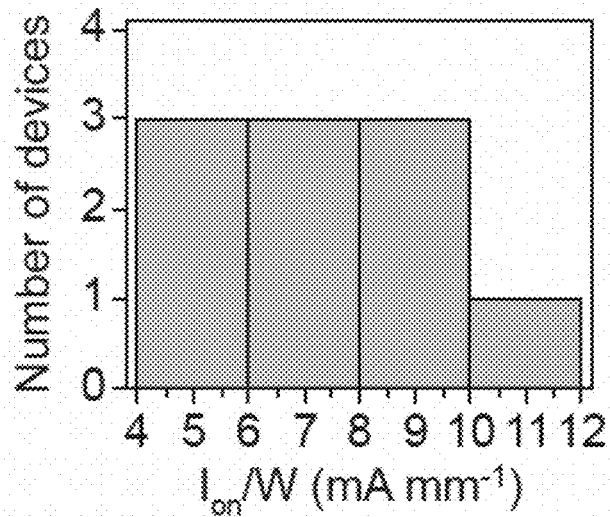
Figure 20C:
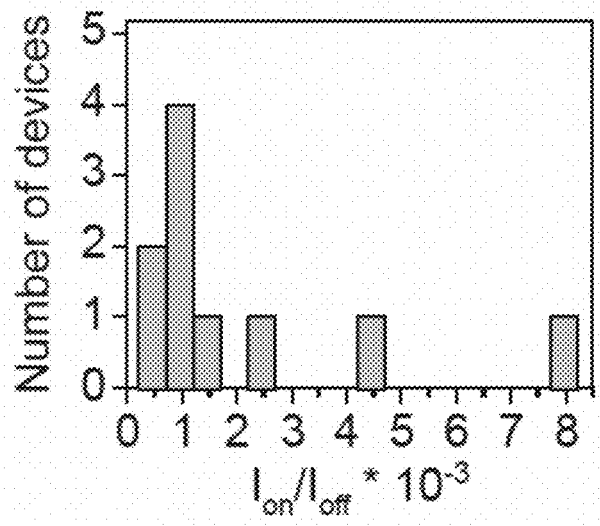

FIGS. 20A-20C represent histograms of transistors showing the statistical distribution of the mobility, unit width-normalized $I_{on}$ and $I_{on}/I_{off}$ (respectively). The results were obtained from 10 different self-healing FET devices to show the distribution of the characteristic parameters. The results show very good repeatability and reproducibility considering that all the FET manufacturing steps were done manually.

Example 10—Fabrication of the FET Device Comprising AgNWs-Based Electrodes

The dimensions of the silver nanowires (AgNWs) were as follows: diameter: ~100-300 nm, length 5-30 µm. This is the type that we used, but we can definitely use different dimensions.

For electrode preparation, AgNWs dispersion (10 mg/ml) was sprayed through a shadow-mask on a slightly modified silicon wafer, prepared by treatment with oxygen plasma and then immersion in a solution of hexyltrichlorosilane in toluene for 1 min (long immersion time leads to very hydrophobic surface, which is not convenient for spraying the aqueous dispersion of CNTs). PUU12 precursor solution (200 mg/ml) in THF consisting of PPG-TDI and APDS with a mass ratio of 100:12 were drop-casted on the gate electrode, left to dry for 1 min, followed by spinning at 1000 rpm for 1 min to obtain ~20 µm PUU substrate and heated to 70° C. for 24 hr. This was transferred to PS-b-PI-b-PS elastic film by applying gentle pressure and heating. The same solution was spin-coated on the source drain electrodes at 2000 rpm to ~2 µm thick dielectric, which was transferred later on to the gate electrode by applying gentle pressure and heat. Semi-conductive CNT ink was prepared by mixing 99% semi-conducting-SWCNT solution, DI-water, propylene glycol and FluroN at the ratio of 1:6:1.25:0.75 (by volume), followed by ultrasonication. Subsequently, semi-conductive CNT ink (30 µL) was drop-casted on the CNT source/drain composite electrodes and heated to 90° C. for 30 min. The device was rinsed in DI water for 1 hr to remove the surfactants, and then left in a vacuum oven at 90° C. for several hours.

Example 11—Characterization of the FET Device Comprising AgNWs-Based Electrodes

Figure 21A:
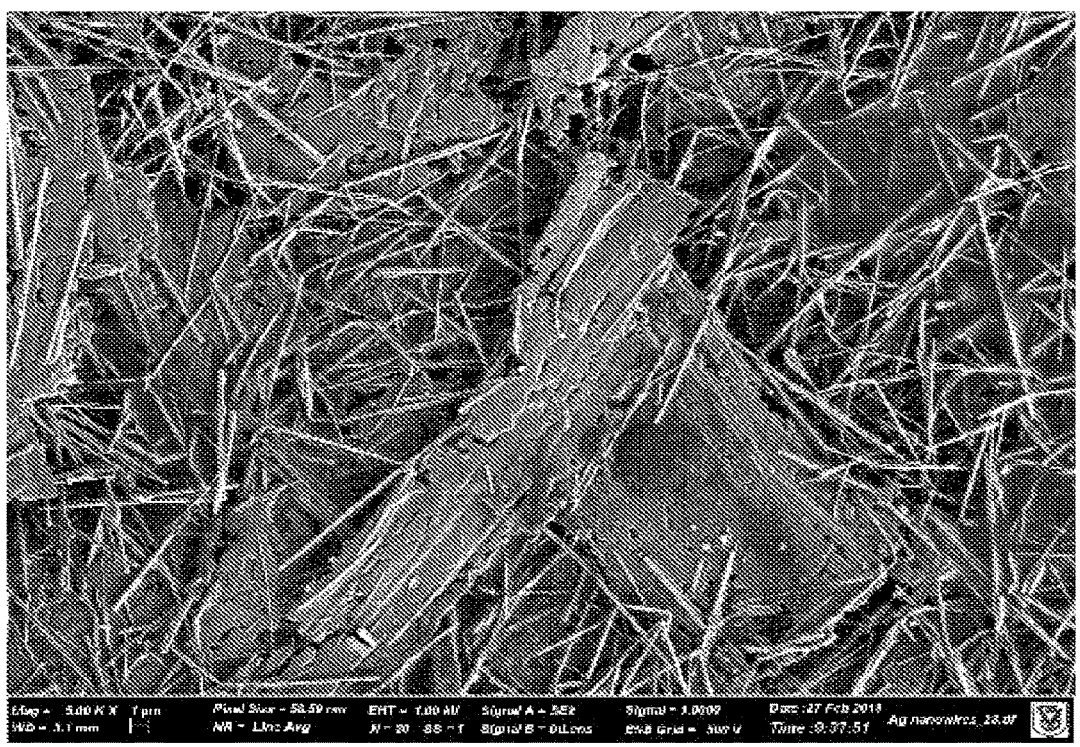
FIGS. 21A-21B: SEM images of silver nanowires (AgNWs) embedded into PUU to form FET electrodes at magnification of 5.00 K.
Figure 21B:
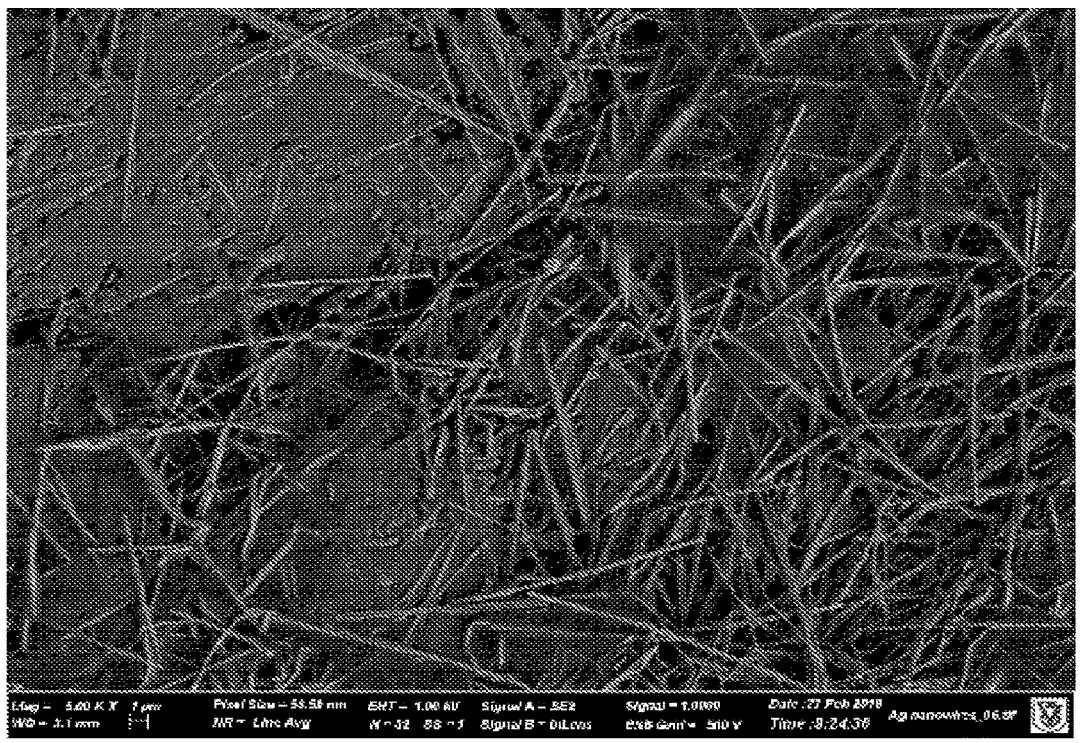
Figure 22A:
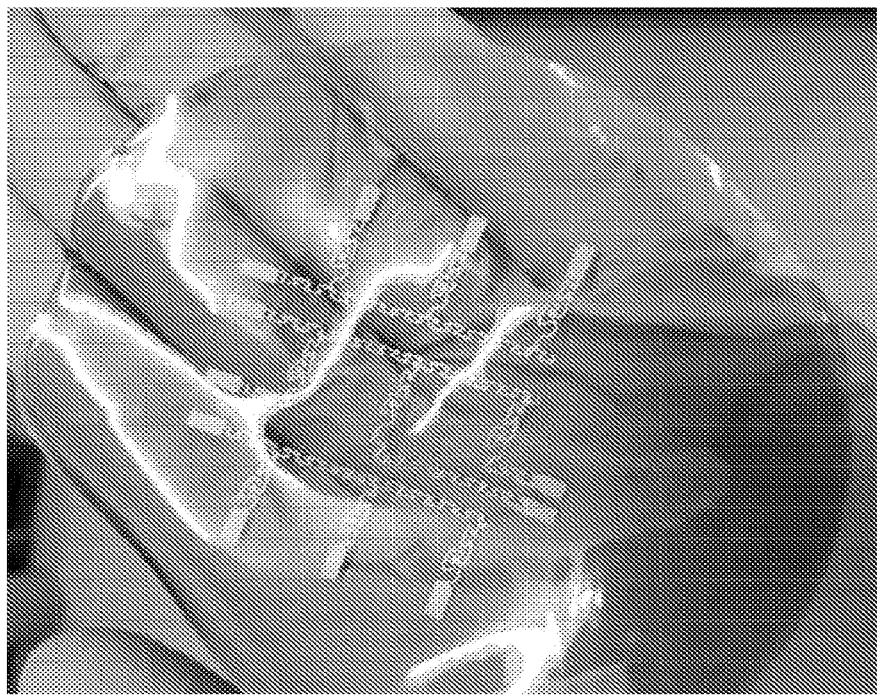
FIGS. 22A-22B: Photograph of the FET device comprising an array of FETs comprising AgNWs-based electrodes and the self-healing PUU12 (FIG. 22A) and magnification of the FETs array area (FIG. 22B).
Figure 22B:
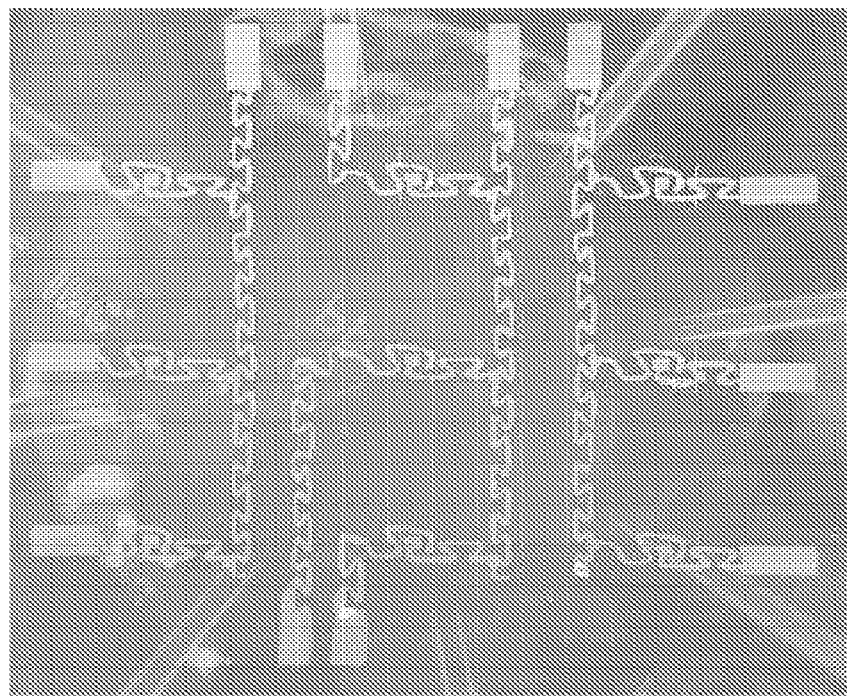
Figure 23:
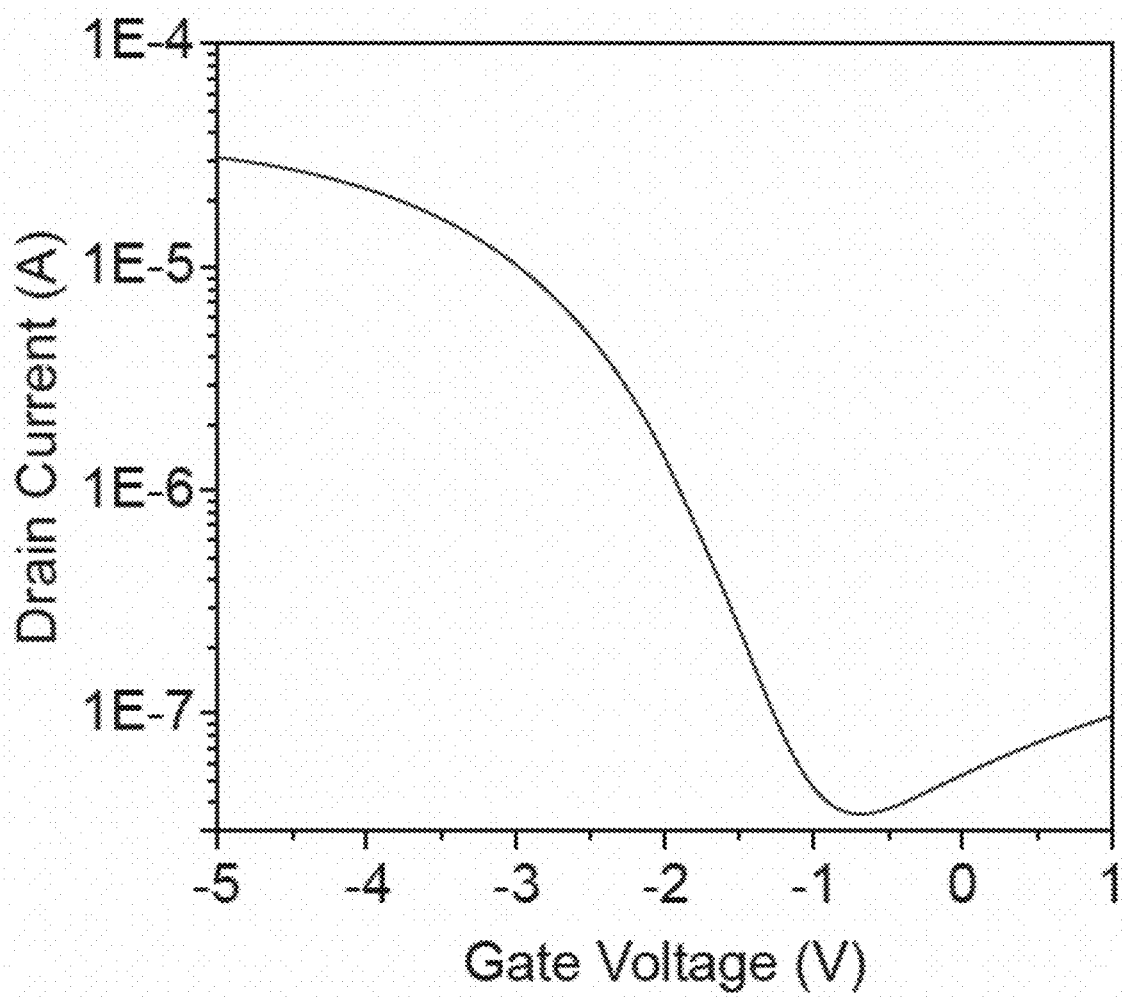
FIG. 23: Performance of the self-healing FET device comprising AgNWs source/drain and gate electrodes, semi-conducting channel of SECNTs and PUU12 polymer.

Silver nanowires were used to prepare conductive electrodes. They were embedded into PUU as a nanocomposite in order to combine both high electrical conductivity and good self-healing ability. These electrodes were used for manufacturing a self-healing FET where the source/drain and gate electrodes were prepared from AgNWs. FIGS. 21A and 21B show SEM images of AgNWs embedded into the surface of PUU, showing a continuous conductive pathway. FIGS. 22A and 22B show a simple e-skin (conductive pathways) made of the self-healing electrodes that are based on AgNWs-PUU nanocomposite. The stretchability and self-healing of the electrodes were tested using such simple devices (e-skin) before applying them into the FET. FIG. 23 represents performance (drain current) of the self-healing FET device comprising AgNWs source/drain and gate electrodes, which was prepared as described in Example 11. It can be seen that the AgNWs electrodes-based FET shows higher currents compared to all-CNT devices. Without wishing to being bound by theory or mechanism of action, it is assumed that the higher currents can be attributed to the higher conductivity of AgNWs electrodes.

It is appreciated by persons skilled in the art that the present invention is not limited by what has been particularly shown and described hereinabove. Rather the scope of the present invention includes both combinations and subcombinations of various features described hereinabove as well as variations and modifications. Therefore, the invention is not to be constructed as restricted to the particularly described embodiments, and the scope and concept of the invention will be more readily understood by references to the claims, which follow.

The invention claimed is:

1. A self-healing field-effect transistor (FET) device comprising:
   a self-healing substrate and a self-healing dielectric layer, said substrate and said layer comprising a disulfide-containing poly(urea-urethane) (PUU) polymer, wherein the dielectric layer has a thickness of less than about 10 μm;
   a gate electrode, at least one source electrode, and at least one drain electrode, said electrodes comprising electrically conductive elongated nanostructures; and
   at least one channel comprising semi-conducting elongated nanostructures.

2. The FET device according to claim 1, being in a form selected from the group consisting of a back-gated transistor, top-gated transistor, and vertical transistor.

3. The FET device according to claim 2, being in a form of a back-gated transistor, wherein the gate electrode is disposed on the self-healing substrate and contacts a bottom side of the dielectric layer, and wherein the at least one source electrode, the at least one drain electrode, and the at least one channel are disposed on a top side of the dielectric layer, the at least one channel being in electric contact with the at least one source electrode and the at least one drain electrode.

4. The FET device according to claim 3, wherein the electrically conductive elongated nanostructures, semi-conducting elongated nanostructures or both are selected from the group consisting of nanotubes, nanowires, nanoribbons, nano-whiskers, nanostrips, nanorods, and combinations thereof.

5. The FET device according to claim 1, wherein the electrically conductive elongated nanostructures are made of a material selected from the group consisting of a metal, metal alloy, carbon, and combinations thereof; or wherein the semi-conducting elongated nanostructures are made of a material selected from the group consisting of carbon, silicon, and combinations thereof.

6. The FET device according to claim 5, wherein the electrically conductive elongated nanostructures comprise electrically conductive carbon nanotubes (CNTs) and the semi-conducting elongated nanostructures comprise semi-conducting CNTs; or wherein the electrically conductive elongated nanostructures comprise silver nanowires (AgNWs) and the semi-conducting elongated nanostructures comprise semi-conducting CNTs.

7. The FET device according to claim 1, wherein the electrically conducting elongated nanostructures of the gate electrode are embedded within the self-healing substrate; or wherein the semi-conducting elongated nanostructures of the at least one channel are deposited onto the at least one source electrode and the at least one drain electrode or embedded within a surface portion of the dielectric layer.

8. The FET device according to claim 1, wherein the self-healing substrate has a thickness of less than about 5 μm or wherein the dielectric layer has a thickness of less than about 5 μm or wherein the FET device has a thickness of less than about 10 μm.

9. The FET device according to claim 1, wherein the disulfide-containing poly(urea-urethane) polymer is composed of a 4-aminophenyl disulfide (APDS) monomer and a poly(propylene glycol) tolylene 2,4-diisocyanate terminated (PPG-TDI) monomer.

10. The FET device according to claim 9, wherein the mass of the PPG-TDI monomer is at least 7 times higher than the mass of the APDS monomer; or wherein the mass ratio between the APDS monomer and the PPG-TDI monomer ranges from about 11:100 to about 13:100.

11. The FET device according to claim 1, wherein the at least one channel has a thickness of less than about 50 nm; or wherein the channel has a length of less than about 500 μm and width of less than about 1 cm; or wherein the at least one source electrode and the at least one drain electrode and the gate electrode have a thickness of less than about 500 nm.

12. The FET device according to claim 1, comprising a plurality of source electrodes, a plurality of drain electrodes, and a plurality of channels.

13. The FET device according to claim 1, further comprising an elastic layer, comprising a polymer selected from the group consisting of polystyrene-block-polyisoprene-block-polystyrene (PS-b-PI-b-PS), polydimethylsiloxane (PDMS), polybutadiene rubber, polyurethane thermoplastic elastomer, and combinations and derivatives thereof.

14. The FET device according to claim 13, wherein the elastic layer contacts the self-healing substrate; or wherein the elastic layer contacts the at least one channel, the at least one source electrode and/or the at least one drain electrode.

15. The FET device according to claim 1, further comprising a protecting layer comprising a polymer selected from the group consisting of PDMS, PS-b-PI-b-PS, 1-styrene-butadiene-styrene block copolymer (SBS), 2-styrene ethylene butylene styrene block copolymer (SEBS), polybutadiene rubber, polyurethane thermoplastic elastomer, and combinations and derivatives thereof.

16. The FET device according to claim 15, wherein the protecting layer contacts the at least one channel, the at least one source electrode and the at least one drain electrode, or the elastic layer.

17. The FET device according to claim 1 further comprising a backing layer comprising a material selected from the group consisting of cellulose, polyethylene terephthalate (PET), polyethylene naphthalate (PEN), polyimide (Kapton), and combinations and derivatives thereof; or further comprising an adhesive layer, comprising a polymer selected from the group consisting of polyvinyl alcohol (PVA), polyethyleneimine (PEI) and polyethylene glycol (PEG).

18. The FET device according to claim 17, wherein the backing layer and/or the adhesive layer contacts the self-healing substrate.

19. The FET device according to claim 1, which does not include a substrate made of a material other than the disulfide-containing PUU polymer.

20. The FET device according to claim 1, configured for temperature sensing, humidity sensing or both; or integrated on electronic or artificial skin surface; or coupled to a detection device for measuring a change in at least one property of the at least one drain electrode, at least one source electrode, gate electrode, or any combination thereof, said at least one property selected from the group consisting of current, threshold voltage, hole mobility, and electrical potential.

* * * * *